(12) United States Patent
Tam

(10) Patent No.: US 11,337,575 B2
(45) Date of Patent: May 24, 2022

(54) FILTER ASSEMBLY AND FLOOR CLEANER

(71) Applicant: BISSELL Inc., Grand Rapids, MI (US)

(72) Inventor: Kin-leung Tam, Hong Kong (CN)

(73) Assignee: BISSELL Inc., Grand Rapids, MI (US)

( * ) Notice: Subject to any disclaimer, the term of this patent is extended or adjusted under 35 U.S.C. 154(b) by 0 days.

(21) Appl. No.: 17/408,800

(22) Filed: Aug. 23, 2021

(65) Prior Publication Data

US 2021/0378477 A1 Dec. 9, 2021

(30) Foreign Application Priority Data

Jul. 23, 2021 (CN) .......................... 2021-10839666.6
Jul. 23, 2021 (CN) .......................... 2021-21697891.2

(51) Int. Cl.
*A47L 11/40* (2006.01)
*B01D 46/00* (2022.01)
*G01R 33/07* (2006.01)
*B01D 46/52* (2006.01)
*B01D 46/42* (2006.01)
*B01D 46/10* (2006.01)
*A47L 11/30* (2006.01)
*B01D 46/62* (2022.01)

(52) U.S. Cl.
CPC ......... *A47L 11/4011* (2013.01); *A47L 11/302* (2013.01); *A47L 11/403* (2013.01); *A47L 11/408* (2013.01); *A47L 11/4016* (2013.01); *A47L 11/4025* (2013.01); *A47L 11/4041* (2013.01); *B01D 46/0004* (2013.01); *B01D 46/009* (2013.01); *B01D 46/10* (2013.01); *B01D 46/4227* (2013.01); *B01D 46/521* (2013.01); *B01D 46/645* (2022.01); *G01R 33/07* (2013.01); *B01D 2267/40* (2013.01); *B01D 2271/02* (2013.01); *B01D 2279/55* (2013.01)

(58) Field of Classification Search
CPC .......................... A47L 11/302; A47L 11/4011; A47L 11/4016; A47L 11/4025; A47L 11/403; A47L 11/4041; A47L 11/408; G01R 33/07; B01D 2267/40; B01D 2271/02; B01D 2279/55; B01D 46/0004; B01D 46/0026; B01D 46/009; B01D 46/10; B01D 46/4227; B01D 46/521; H02K 9/02; H02K 9/04

See application file for complete search history.

(56) References Cited

U.S. PATENT DOCUMENTS

| 5,507,847 | A | * | 4/1996 | George | ................ | B01D 39/083 55/486 |
| 6,393,657 | B1 | | 5/2002 | Zimet | | |
| 7,931,716 | B2 | | 4/2011 | Oakham | | |

(Continued)

*Primary Examiner* — Jonathan Miller
*Assistant Examiner* — Gabriel E Gitman
(74) *Attorney, Agent, or Firm* — Warner Norcross + Judd LLP

(57) ABSTRACT

The present disclosure provides a floor cleaner that includes a replaceable component, such as a brushroll or a filter. The floor cleaner has a detection mechanism comprising a magnet on the replaceable component and a Hall Effect sensor positioned to detect the permanent magnet when the replaceable component is correctly installed on the floor cleaner. Operation of one or more electrically-powered components of the floor cleaner is prevented when the permanent magnet is not detected by the Hall Effect sensor.

15 Claims, 14 Drawing Sheets

(56) References Cited

U.S. PATENT DOCUMENTS

| | | | | |
|---|---|---|---|---|
| 2006/0168925 A1* | 8/2006 | Whittemore | ....... | B01D 46/0012 55/490 |
| 2013/0340400 A1* | 12/2013 | Minaeeghainipour | ....................... | B01D 46/0002 55/511 |
| 2016/0052095 A1* | 2/2016 | Simmons | ................ | F16B 5/123 29/281.5 |
| 2019/0006915 A1* | 1/2019 | Lapelosa | ............ | B01D 46/0016 |

* cited by examiner

FILTER ASSEMBLY AND FLOOR CLEANER

TECHNICAL FIELD

The disclosure relates to a filter assembly and a floor cleaner.

BACKGROUND

Multi-surface floor cleaners are adapted for cleaning hard floor surfaces such as tile and hardwood and soft floor surfaces such as carpet and upholstery. Some multi-surface floor cleaners comprise a fluid delivery system that delivers cleaning fluid to a surface to be cleaned and a fluid recovery system that extracts spent cleaning fluid and debris (which may include dirt, dust, stains, soil, hair, and other debris) from the surface. The fluid delivery system typically includes one or more fluid supply tanks for storing a supply of cleaning fluid, a fluid distributor for applying the cleaning fluid to the surface to be cleaned, and a fluid supply conduit for delivering the cleaning fluid from the fluid supply tank to the fluid distributor. An agitator can be provided for agitating the cleaning fluid on the surface. The fluid recovery system typically includes a recovery tank, a nozzle adjacent the surface to be cleaned and in fluid communication with the recovery tank through a working air conduit, and a source of suction in fluid communication with the working air conduit to draw the cleaning fluid from the surface to be cleaned and through the nozzle and the working air conduit to the recovery tank. Other floor cleaners include "dry" vacuum cleaners which can clean different surface types, but do not dispense or recover liquid. Yet another floor cleaners include "wet" cleaners such as steam and hard floor cleaners that dispense cleaning fluid but may or may not apply suction to remove liquid and debris from the surface.

Certain components of floor cleaners, such as brushrolls and filters, may become dirty or wear out over time. To that end, it is helpful to design certain components as removable accessories for cleaning and/or replacement. However, a user may forget to reinstall the components or may reinstall them incorrectly, either of which will negatively impacting cleaning performance and can damage the floor cleaner. A user may also replace these components with low quality replacement versions that do not meet the requirements of the floor cleaner, again leading to poor cleaning performance or damage to the floor cleaner.

BRIEF SUMMARY

According to one aspect of the invention, a floor cleaner is provided with a replaceable component, such as a brushroll or a filter. The floor cleaner has a detection mechanism comprising a magnet on the replaceable component and a Hall Effect sensor positioned to detect the permanent magnet when the replaceable component is correctly installed on the floor cleaner.

In certain embodiments, operation of an electrically-powered component of the floor cleaner is prevented when the permanent magnet is not detected by the Hall Effect sensor.

In certain embodiments, the floor cleaner is a multi-surface wet/dry vacuum cleaner that can be used to clean hard floor surfaces such as tile and hardwood and soft floor surfaces such as carpet. The floor cleaner is provided with a fluid delivery system for storing cleaning fluid and delivering the cleaning fluid to the surface to be cleaned and a recovery system for removing spent cleaning fluid and debris from a surface to be cleaned and storing the spent cleaning fluid and debris onboard the apparatus.

In certain embodiments, the floor cleaner includes an upright handle assembly or body and a cleaning head or base coupled with the body and adapted for movement across a surface to be cleaned.

According to another aspect, a filter assembly for a floor cleaner is provided and includes a filter having an intake side and an exhaust side, a filter housing including a frame having an open area through which air may pass, with the filter supported within the frame, a seal on the filter housing extending around the exhaust side of the filter, a handle projecting from the filter housing, and a permanent magnet disposed on the handle. The magnet is configured to be detected by a sensing component, such as a Hall Effect sensor, when the filter assembly is correctly installed on a floor cleaner.

In certain embodiments, the seal comprises a perimeter seal portion surrounding the exhaust side of the filter and the permanent magnet is disposed outward of the perimeter seal portion, such that the permanent magnet is configured to be disposed outside an air flow path of a floor cleaner.

According to yet another embodiment of the invention, a method for controlling the operation of a floor cleaner comprises allowing operation of an electrically-powered component of the floor cleaner when a permanent magnet on an accessory component is detected by a sensing component and preventing operation of the electrically-powered component of the floor cleaner when a permanent magnet on an accessory component is not detected by the sensing component, wherein the permanent magnet on the accessory component is within the effective sensing zone of a sensing component when correctly installed on the floor cleaner, whereby the electrically-powered component the electrically-powered component is prevented from operating when the accessory component is missing from the floor cleaner, incorrectly mounted on the floor cleaner, or an accessory component that does not comprise a permanent magnet is installed on the floor cleaner.

These and other features and advantages of the present disclosure will become apparent from the following description of particular embodiments, when viewed in accordance with the accompanying drawings and appended claims.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DESCRIPTION OF EMBODIMENTS OF THE INVENTION

The invention generally relates to a floor cleaner for cleaning floor surfaces such as carpets, area rugs, wood, tile, and the like, and systems for detecting whether accessory components of the floor cleaner are present and properly installed. The invention also relates to accessory components for a floor cleaner, including a brushroll and a filter.

Figure 1:
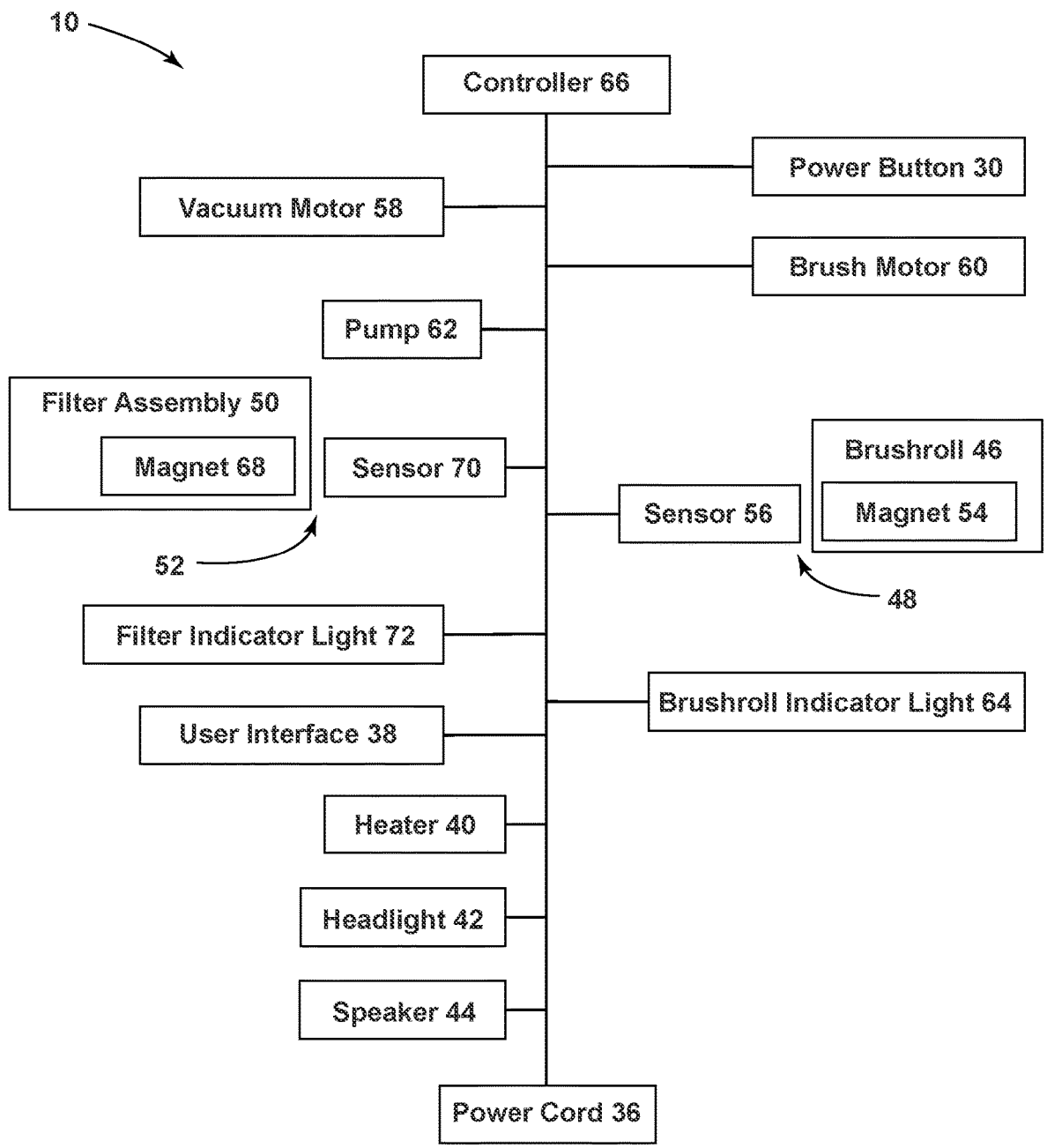
FIG. 1 is a schematic view of a floor cleaner according to one aspect of the present disclosure.

FIG. 1 is a schematic view of a floor cleaner 10 according to one aspect of the present disclosure. As discussed in further detail below, the floor cleaner 10 is provided with various features and improvements, including a replaceable brushroll 46 and a brushroll detection mechanism 48, and a replaceable filter assembly 50 and a filter detection mechanism 52.

The brushroll detection mechanism 48 can include a detectable component, such as a permanent magnet 54, disposed on and carried by the brushroll 46 and a sensing component, such as a Hall Effect sensor 56 or a reed switch, disposed on the floor cleaner 10 in a position to sense the detectable component when the brushroll 46 is correctly installed in a brush chamber on the floor cleaner 10 that receives the brushroll 46. The detectable component can be provided on a stationary or non-rotatable portion of the brushroll 46.

The detectable component is configured to be detected by the sensing component within an effective sensing zone of the sensing component. Direct physical contact between the detectable component and sensing component is not required, as the effective sensing zone can detect the detectable component within a predetermined distance away from the sensing component. The predetermined distance can be distance within which the detectable component is spaced from the sensing component when the brushroll 46 is correctly mounted in the brush chamber.

The brushroll detection mechanism 48 is configured to allow operation of an electrically-powered component of the floor cleaner 10 when the detectable component is detected by the sensing component and to prevent operation of the electrically-powered component when the detectable component is not detected by the sensing component. If the brushroll 46 is missing from the brush chamber, incorrectly mounted, or a brushroll that does not comprise a detectable component is mounted instead, the electrically-powered component is prevented from operating.

The brushroll detection mechanism 48 can include or be operably coupled with a switch configured to close and supply power to the electrically-powered component of the floor cleaner 10 when an authorized brushroll 46 is correctly mounted in the brush chamber. If the brushroll 46 is missing from the brush chamber, incorrectly mounted, or a brushroll lacking a detectable component is mounted instead, the switch is configured to open, so that no power is supplied to the component of the floor cleaner 10.

The component controlled via the brushroll detection mechanism 48 may be a vacuum motor 58, a brushroll motor 60, or a pump 62, or any combination thereof. Other components that may be powered depending upon whether the brushroll 46 is detected include a user interface 38, a heater 40, a controller 66, a headlight 42, and a speaker 44.

In embodiments in which the sensing component is a Hall Effect sensor, the Hall sensor may be arranged to act as the switch configured to close and supply power to a component of the floor cleaner 10 when the brushroll 46 is correctly installed in the brush chamber. When a magnetic field experienced by the Hall Effect sensor exceeds a pre-determined value, the Hall Effect sensor can change state. The Hall Effect sensor will again change state if a magnetic field experienced by the Hall Effect sensor falls below the predetermined value.

The floor cleaner 10 can include a controller 66 operably coupled with the various functional systems of the apparatus, including, but not limited to, the fluid delivery and recovery systems, for controlling its operation. In one embodiment, the controller 66 can comprise a microcontroller unit (MCU) that contains at least one central processing unit (CPU). A user of the floor cleaner 10 can interact with the controller 66 via the user interface 38.

The controller 66 detects the state of the switch, e.g. the state of the Hall Effect sensor 56. The controller 66 is arranged selectively to allow or prevent the supply of power to the component depending upon the state of the switch. This in turn is dependent upon the distance between the Hall Effect sensor 56 and the permanent magnet 54.

In some embodiments, when a power button 30 is pressed, or another input control actuated, in an attempt to turn the floor cleaner 10 on, and the permanent magnet 54 is not detected by the Hall Effect sensor 56, the Hall Effect sensor 56 can send a signal to the controller 66 to cause the floor cleaner 10 to provide a status update to the user. For example, the floor cleaner 10 can deliver a visual and/or audio warning message to the user. The warning message can indicate to the user that the brushroll 46 is missing from the brush chamber, incorrectly mounted, or a brushroll lacking a detectable component is mounted instead. The warning message may indicate to the user that the brushroll 46 must be correctly mounted before operating the floor cleaner 10. The visual and/or audio warning can be issued for a predetermined period, such as for 2-10 seconds, and then cease. The warning may be repeated if the user again attempts to turn on the floor cleaner 10 when the permanent magnet 54 is still not detected by the Hall Effect sensor 56.

To issue the warning message, power may be supplied to limited components of the floor cleaner 10, such as to only those components required to issue the warning message. For example, the controller 66, user interface 38, speaker 44, or a brushroll indicator light 64 may be powered temporarily to issue the warning message, and then automatically powered off.

In one embodiment, when the power button 30 is pressed and the permanent magnet 54 is not detected by the Hall Effect sensor 56, the brushroll indicator light 64 flashes or is otherwise illuminated, and an audio warning sound is issued from the speaker 44. The indicator light 64 may be an LED positioned near the brush chamber for the brushroll 46 so that a user's attention is drawn to the brush chamber. For example, for the embodiment shown in FIG. 2, the brushroll indicator light 64 can be located on the base 14.

In another embodiment, the switch can be separate from but operably coupled with the sensing component. It is further noted that in embodiments where power to multiple components is controlled based on whether the brushroll 46 is correctly installed in the brush chamber, multiple switches and/or controllers may be provided.

The filter detection mechanism 52 can include a detectable component, such as a permanent magnet 68, disposed on and carried by the filter assembly 50 and a sensing component, such as a Hall Effect sensor 70 or a reed switch, disposed on the floor cleaner 10 in a position to sense the detectable component when the filter assembly 50 is correctly installed in the floor cleaner 10, with a filter of the filter assembly 50 located in a recovery pathway of the floor cleaner 10.

The recovery pathway can include at least a dirty inlet and a clean air outlet. The pathway can be formed by, among other elements, a suction source that includes the vacuum motor 58 and that is in fluid communication with the dirty inlet and a recovery tank or other collection container. The filter assembly 50 can be mountable at various locations on the floor cleaner 10 such that the filter is located in the recovery pathway, including anywhere in between the dirty inlet and the clean air outlet. For example, the filter assembly 50 can comprise a pre-motor filter installable in the recovery pathway upstream of the suction source that includes the vacuum motor 58. In another embodiment, the filter assembly 50 can be a post-motor filter installable in the recovery pathway downstream of the suction source that includes the vacuum motor 58.

With the filter of the filter assembly 50 being located in the recovery pathway, working air passes through the filter. The detectable component on the filter assembly 50 can be provided outside the recovery pathway. By providing the detectable component outside the recovery pathway, the detectable component is not exposed to debris in the working air, is less likely to become dirty or damaged. Further features for protecting the detectable component and sensing component are described in further detail below.

The detectable component is configured to be detected by the sensing component within an effective sensing zone of the sensing component. Direct physical contact between the detectable component and sensing component is not required, as the effective sensing zone can detect the detectable component within a predetermined distance away from the sensing component. The predetermined distance can be distance within which the detectable component is spaced from the sensing component when the filter assembly 50 is correctly installed on the floor cleaner 10.

The filter detection mechanism 52 is configured to allow operation of an electrically-powered component of the floor cleaner 10 when the detectable component is detected by the sensing component and to prevent operation of the electrically-powered component when the detectable component is not detected by the sensing component. If the filter assembly 50 is missing, incorrectly mounted, or a filter assembly that does not comprise a detectable component is mounted instead, the electrically-powered component is prevented from operating.

The filter detection mechanism 52 can include or be operably coupled with a switch configured to close and supply power to a component of the floor cleaner 10 when the filter assembly 50 is correctly mounted in the recovery pathway. If the filter assembly 50 is missing from the recovery pathway, incorrectly mounted, or a filter assembly lacking a detectable component is mounted instead, the switch is configured to open, so that no power is supplied to the component of the floor cleaner 10.

The component controlled via the filter detection mechanism 52 may be the vacuum motor 58, the brushroll motor 60, or the pump 62, or any combination thereof. Other components that may be powered depending upon whether the filter assembly 50 is detected include the user interface 38, heater 40, controller 66, headlight 42, and speaker 44.

In embodiments in which the sensing component is a Hall Effect sensor, the Hall sensor may be arranged to act as the switch configured to close and supply power to a component of the floor cleaner 10 when the filter assembly 50 is correctly mounted in the recovery pathway. When a magnetic field experienced by the Hall Effect sensor exceeds a pre-determined value, the Hall Effect sensor can change state. The Hall Effect sensor will again change state if a magnetic field experienced by the Hall Effect sensor falls below the pre-determined value.

The controller 66 detects the state of the switch, e.g. the state of the Hall Effect sensor 70. The controller 66 is arranged selectively to allow or prevent the supply of power to the component depending upon the state of the switch. This in turn is dependent upon the distance between the Hall Effect sensor 70 and the permanent magnet 68.

In some embodiments, when a power button 30 is pressed, or another input control actuated, in an attempt to turn the floor cleaner 10 on, and the permanent magnet 68 is not detected by the Hall Effect sensor 70, the Hall Effect sensor 70 can send a signal to the controller 66 to cause the floor cleaner 10 to provide a status update to the user. For example, the floor cleaner 10 can deliver a visual and/or audio warning message to the user. The warning message can indicate to the user that the filter assembly 50 is missing from the recovery pathway, incorrectly mounted, or a filter assembly lacking a detectable component is mounted instead. The warning message may indicate to the user that the filter assembly 50 must be correctly installed before operating the floor cleaner 10. The visual and/or audio warning can be issued for a predetermined period, such as for 2-10 seconds, and then cease. The warning may be repeated if the user again attempts to turn on the floor cleaner 10 when the permanent magnet 68 is still not detected by the Hall Effect sensor 70.

To issue the warning message, power may be supplied to limited components of the floor cleaner 10, such as to only those components required to issue the warning message. For example, the controller 66, user interface 38, speaker 44, or a filter indicator light 72 may be powered temporarily to issue the warning message, and then automatically powered off.

In one embodiment, when the power button 30 is pressed and the permanent magnet 68 is not detected by the Hall Effect sensor 70, the filter indicator light 72 flashes or is otherwise illuminated, and an audio warning sound is issued from the speaker 44. The indicator light 72 may be an LED positioned near the brush chamber for the filter assembly 50 so that a user's attention is drawn to the filter receiver. For example, for the embodiment shown in FIG. 2, the filter indicator light 72 can be located on the carry handle 28.

In another embodiment, the switch can be separate from but operably coupled with the sensing component. It is further noted that in embodiments where power to multiple components is controlled based on whether the filter assembly 50 is correctly mounted in the recovery pathway, multiple switches and/or controllers may be provided.

It is noted that the brushroll detection mechanism 48 and the filter detection mechanism 52 may be used together or separately, and may be combined in any order or combination. For example, a floor cleaner could comprise the brushroll detection mechanism 48 and not the filter detection mechanism 52, or vice versa. While the brushroll detection and the filter detection may be applied separately, the systems and methods discussed herein are not mutually exclusive. For example, by supplementing brushroll detection with filter detection, an authorized brushroll and an authorized filter must both be correctly mounted in their respective compartments or the floor cleaner 10 will not operate.

While the floor cleaner 10 of FIG. 1 is shown as including the vacuum motor 58, the brushroll motor 60, the pump 62, the user interface 38, the heater 40, the headlight 42, the speaker 44, the brushroll indicator light 64, and the filter indicator light 72, it is understood that the different components may be used in combination with each other as desired, or may be used separately. That one floor cleaner is illustrated herein as having all of these components does not mean that all of these features must be used in combination, but rather done so here for brevity of description.

The functional systems of the floor cleaner 10 can be arranged into any desired configuration, such as an upright device having a base and an upright body for directing the base across the surface to be cleaned, a canister device having a cleaning implement connected to a wheeled base by a vacuum hose, a portable device adapted to be hand carried by a user for cleaning relatively small areas, or a commercial device. Any of the aforementioned cleaners can be adapted to include a flexible vacuum hose, which can form a portion of the working air conduit between a nozzle and the suction source.

Figure 2:
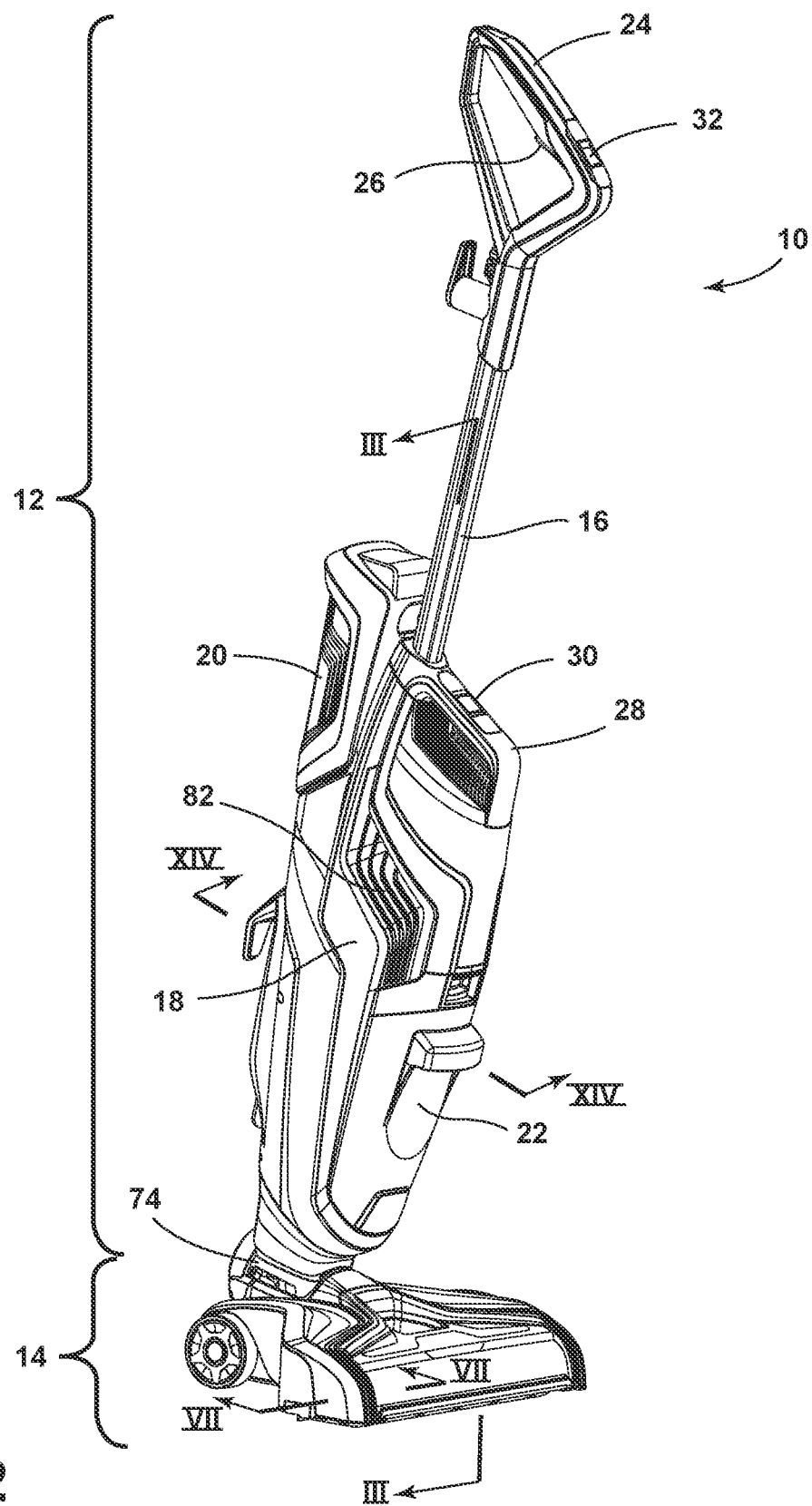
FIG. 2 is a front perspective view of a floor cleaner according to another aspect of the present disclosure.
Figure 3:
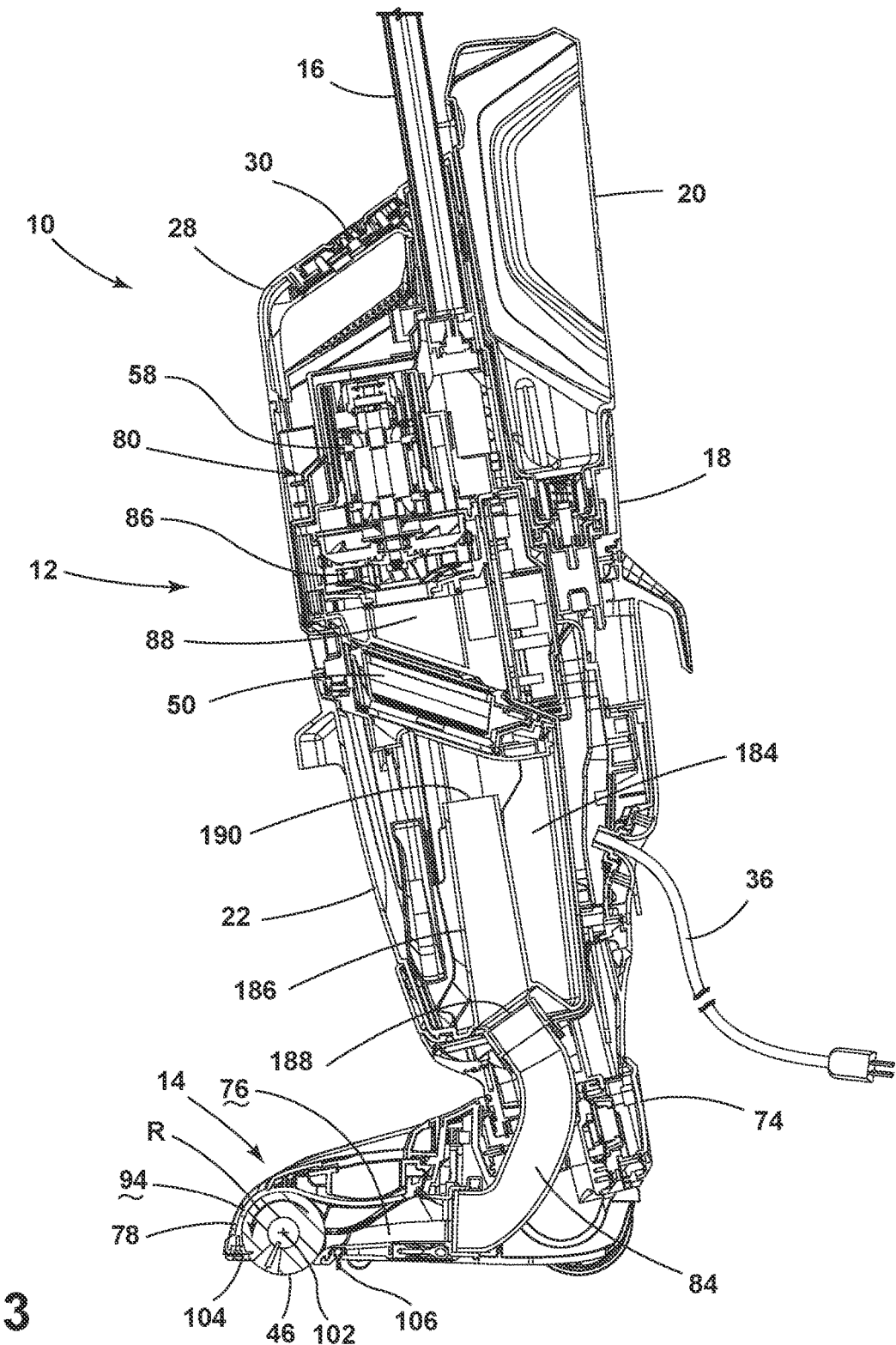
FIG. 3 is a cross-sectional view of the floor cleaner taken through line III-III of FIG. 2.

FIGS. 2-3 show an embodiment of the floor cleaner 10 in the form of an upright multi-surface wet/dry vacuum cleaner having a housing that includes an upright handle assembly or body 12 and a cleaning foot or base 14 mounted to or coupled with the upright body 12 and adapted for movement across a surface to be cleaned. As used herein, the term "multi-surface wet vacuum cleaner" includes a vacuum cleaner that can be used to clean hard floor surfaces such as tile and hardwood and soft floor surfaces such as carpets and area rugs. The replaceable brushroll 46 is disposed on and removable from the base 14. The replaceable filter assembly 50 is disposed on and removable from the upright body 12, but in other embodiments may be removable from other portions of the floor cleaner 10.

For purposes of description related to the figures showing the upright multi-surface wet/dry vacuum cleaner, the terms "upper," "lower," "right," "left," "rear," "front," "vertical," "horizontal," "inner," "outer," and derivatives thereof shall relate to the disclosure as oriented in FIG. 2 from the perspective of a user behind the floor cleaner 10, which defines the rear of the floor cleaner 10. However, it is to be understood that the disclosure may assume various alternative orientations, except where expressly specified to the contrary.

The upright body 12 can comprise a handle 16 and a frame 18. The frame 18 can comprise a main support section at least partially supporting a supply tank 20 and a recovery tank 22, and may further support additional components of the upright body 12. The floor cleaner 10 can include a fluid delivery or supply pathway, including and at least partially defined by the supply tank 20, for storing cleaning fluid, e.g. cleaning liquid, and delivering the cleaning fluid to the surface to be cleaned and a recovery pathway, including and at least partially defined by the recovery tank 22, for removing liquid and debris from the surface to be cleaned and storing the liquid and debris until emptied by the user.

The handle 16 can include a hand grip 24 and a trigger 26 mounted to the hand grip 24, which controls fluid delivery from the supply tank 20 via an electronic or mechanical coupling with the supply tank 20. Other actuators, such as a thumb switch instead of the trigger 26, can be provided for controlling fluid delivery. A carry handle 28 can be disposed on a front side of the frame 18, below the stick handle 16, and can facilitate manual lifting and carrying of the floor cleaner 10.

A moveable joint assembly 74 can be formed at a lower end of the frame 18 and moveably mounts the base 14 to the upright body 12. In the embodiment shown herein, the upright body 12 can pivot up and down about at least one axis relative to the base 14. The joint assembly 74 can alternatively comprise a universal joint, such that the upright body 12 can pivot about at least two axes relative to the base 14. Wiring and/or conduits can optionally supply electricity, air and/or liquid (or other fluids) between the base 14 and the upright body 12, or vice versa, and can extend though the joint assembly 74. The upright body 12 can pivot, via the joint assembly 74, to an upright or storage position, an example of which is shown in FIG. 2, and a reclined or use position (not shown), in which the upright body 12 is pivoted rearwardly relative to the base 14 to form an acute angle with the surface to be cleaned. In this position, a user can partially support the apparatus by holding the hand grip 24.

The floor cleaner 10 can include one or more user interfaces (UI) through which a user can interact with the floor cleaner 10. The UI can enable operation and control of the floor cleaner 10 from the user's end, and can provide feedback information from the floor cleaner 10 to the user. The UI can be electrically coupled with electrical components, including, but not limited to, circuitry electrically connected to various components of the fluid delivery and recovery systems of the floor cleaner 10, as described in further detail below. The UI includes one or more input controls, such as but not limited to buttons, triggers, toggles, keys, switches, or the like, operably connected to systems in the floor cleaner 10 to affect and control its operation.

In the illustrated embodiment, the floor cleaner 10 includes a first input control on the carry handle 28 and a second input control 32 on the hand grip 24. In one embodiment, first input control is a power button 30 that controls the supply of power to one or more electrical components of the floor cleaner 10, in conjunction with the brushroll detection mechanism and/or filter detection mechanism as described herein. The other input control 32 includes a cleaning mode button that cycles the floor cleaner 10 between different cleaning modes. Some examples of cleaning modes include a hard floor cleaning mode and an area rug or carpet cleaning mode. In one example, in each cleaning mode the vacuum motor 58, the pump 62, and the brushroll motor 60 are activated, with the vacuum motor 58 operating at a lower power level and the pump 62 operating at a lower flow rate in the hard floor mode. Those rates increase in the area rug cleaning mode. Other cleaning modes are possible.

Electrically-powered components of the floor cleaner 10 can be powered by a power cord 36 plugged into a household power supply. In yet another embodiment, the floor cleaner 10 can be powered by a battery, preferably a rechargeable battery, for cordless operation.

The fluid delivery system is configured to deliver cleaning fluid from the supply tank 20 to a surface to be cleaned, and can include, as briefly discussed above, a fluid delivery or supply pathway. The supply tank 20 includes a supply chamber for holding cleaning fluid. The cleaning fluid can comprise one or more of any suitable cleaning liquids, including, but not limited to, water, compositions, concentrated detergent, diluted detergent, etc., and mixtures thereof. For example, the liquid can comprise a mixture of water and concentrated detergent. Alternatively, supply tank 20 can include multiple supply chambers, such as one chamber containing water and another chamber containing a cleaning agent. As yet another alternative, the floor cleaner 10 can comprise multiple supply tanks. It is noted that while the floor cleaner 10 described herein is configured to deliver a cleaning liquid, aspects of the disclosure may be applicable to floor cleaner that deliver steam. Thus, the term "cleaning fluid" may encompass both liquid and steam unless otherwise noted.

The recovery system is configured to remove liquid and debris from the surface to be cleaned and store the liquid and debris on the floor cleaner 10 for later disposal, and can include, as briefly discussed above, a recovery pathway 76. The recovery pathway 76 can include at least a dirty inlet and a clean air outlet. The pathway can be formed by, among other elements, a suction nozzle 78 defining the dirty inlet, a suction source 80 in fluid communication with the suction nozzle 78 for generating a working air stream, the recovery tank 22, and at least one exhaust vent 82 defining the clean air outlet.

The recovery tank 22 is a working air treatment assembly, and removes liquid and debris from the working airstream and collects the liquid and debris for later disposal. A portion of the recovery tank 22 can define a portion of the recovery pathway 76. It is understood that other types of working air treatment assemblies for removing and collecting debris and/or liquid from the working airstream for later disposal can be used, such as a cyclonic separator, a centrifugal separator, a bulk separator, a filter bag, or a water-bath separator. The type of working air treatment assembly may depend on the type of floor cleaner, whether the apparatus performs dry cleaning, wet cleaning, or both, and so on.

In the illustrated embodiment, the suction source 80 and recovery tank 22 are provided on the upright body 12, although other locations are possible. At least a portion of the recovery pathway 76 between the suction nozzle 78 and the recovery tank 22 can be formed by a conduit 84 extending through the joint assembly 74, from the base 14 to the upright body 12. Thus it is noted that, for the illustrated embodiment, the recovery pathway 76 is defined by portions of the suction nozzle 78, conduit 84, recovery tank 22, and suction source 80, with the brushroll 46 being disposed in the recovery pathway 76 at the suction nozzle 78 and a filter of the filter assembly 50 being disposed in the recovery pathway 76 downstream of the recovery tank 22. Other arrangements for the recovery pathway 76, the brushroll 46, and the filter assembly 50 are possible, as described in further detail below.

The suction nozzle 78 can be provided on the base 14 can be adapted to be adjacent the surface to be cleaned as the base 14 moves across a surface, and is in fluid communication with the recovery tank 22, for example through conduit 84. The replaceable brushroll 46 can be disposed in suction nozzle 78, and therefore in the recovery pathway 76, with the brushroll 46 agitating the surface to be cleaned so that the debris is more easily ingested into the suction nozzle 78. The suction nozzle 78 positioned to recover liquid and debris indirectly from the floor surface via the brushroll 46. In other embodiments, the brushroll 46 can be outside the recovery pathway, for example to mop the floor surface, with the suction nozzle 78 positioned to recover liquid and debris directly from the floor surface.

While a single horizontally-rotating brushroll 46 is shown herein, in some embodiments, dual horizontally-rotating brushrolls, one or more vertically-rotating brushrolls, or a stationary brush can be provided on the floor cleaner 10.

The suction source 80, which can be a motor/fan assembly including the vacuum motor 58 and a fan 86, is provided in fluid communication with the recovery tank 22. The suction source 80 can be positioned within the frame 18, such as above the recovery tank 22, and is fluidly downstream of the recovery tank 22. At least a portion of the recovery pathway 76 between the recovery tank 22 and the suction source 80 can be formed by a chamber 88 in the upright body 12.

The filter assembly 50, in the illustrated embodiment, is a pre-motor filter assembly and is provided in the recovery pathway 76 downstream of the recovery tank 22 and upstream of the suction source 80. The floor cleaner 10 can also be provided with one or more additional filters upstream or downstream of the recovery tank 22 and/or the suction source 80.

Figure 4:
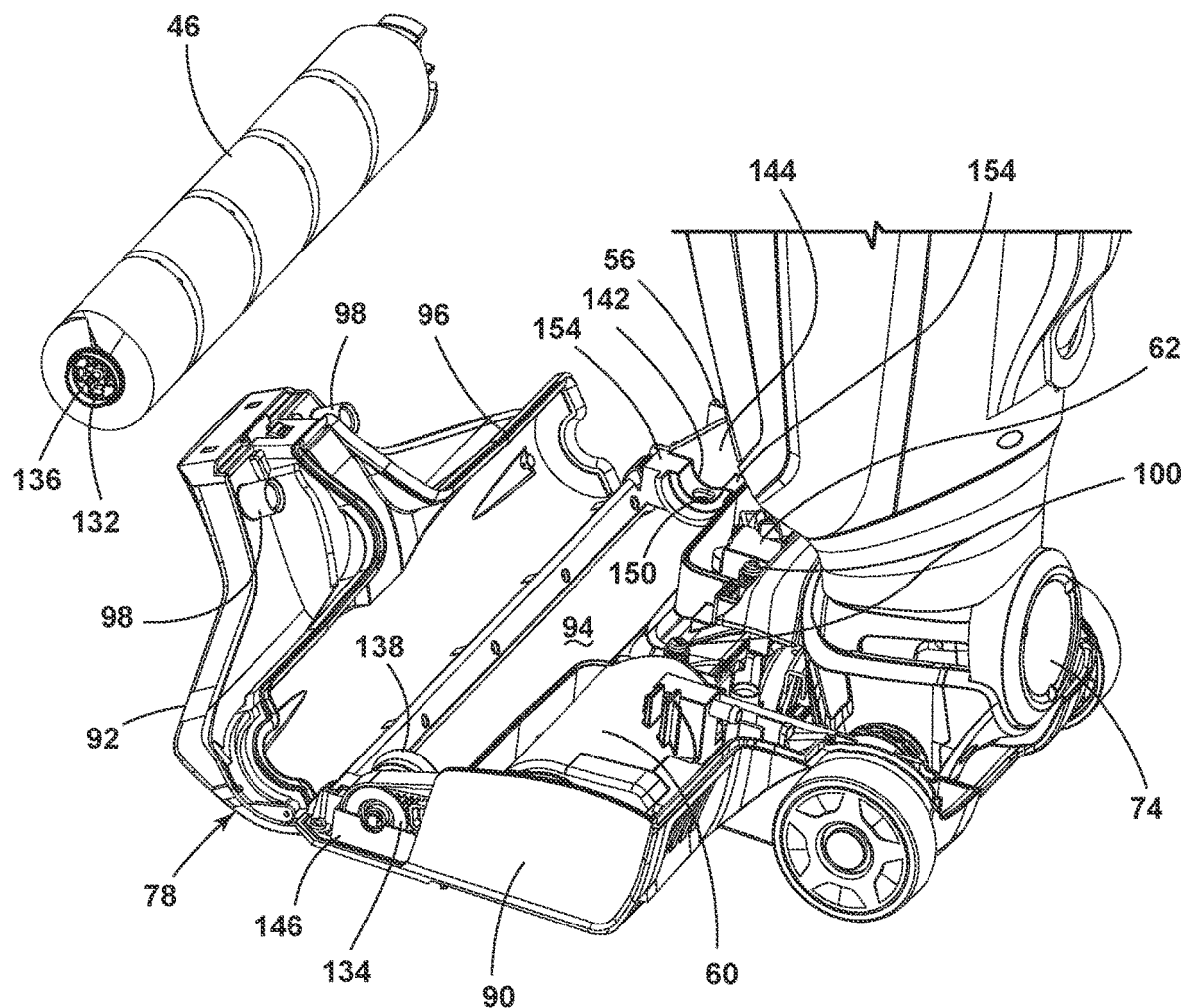
FIG. 4 is a rear perspective view of a lower portion of the floor cleaner, with a nozzle cover moved to an open position and a brushroll shown removed from a brush chamber of the floor cleaner.

Referring to FIG. 4, the base 14 can comprise a base housing 90 and the suction nozzle 78 can comprise a nozzle cover 92 coupled to the base housing 90. As shown in FIG. 4, the nozzle cover 92 can be removable from the base housing 90 to access the brushroll 46, which is removable from a brush chamber 94 of the base 14. The brush chamber 94 may be formed by the base housing 90 and/or another portion of the base 14, with the nozzle cover 92 closing the brush chamber 94 to capture the brushroll 46 therein. Accordingly, the nozzle cover 92 is removed from the base housing 90 prior to removing the brushroll 46. In other embodiments, the brushroll 46 and brush chamber 94 can be configured so that prior removal of a nozzle cover is not required, such as by having the brushroll 46 removable through lateral side of the base 14 or from the underside of the base 14.

The fluid delivery system can comprise a flow control system for controlling the flow of cleaning fluid from the supply tank 20 to a distributor 96 configured to distribute or dispense the fluid. In one configuration, the flow control system can comprise the pump 62, which pressurizes the system. The pump 62 can be positioned within the base 14, and is in fluid communication with the supply tank 20, for example via conduit (not shown) that may pass interiorly to joint assembly 74. In another configuration, the pump 62 can be eliminated and the flow control system can comprise a gravity-feed system having a valve fluidly coupled with an outlet of the supply tank 20, whereby when valve is open, cleaning fluid will flow under the force of gravity to the distributor 96.

The trigger 26 (FIG. 2) can be operably coupled with the flow control system such that pressing the trigger 26 will deliver cleaning fluid to the distributor 96. For example, the delivery system can include a valve (not shown) in the fluid pathway extending between the pump 62 and the distributor 96, and the trigger 26 can selectively open the valve to permit fluid to flow out of the distributor 96.

In one embodiment, the distributor 96 can comprise spray tips on the base 14 positioned to deliver cleaning fluid to the brushroll 46, thereby indirectly providing cleaning fluid to the floor surface, or can be positioned to deliver cleaning fluid directly to the floor surface. Other embodiments of the distributor 96 are possible, such as a spray manifold having multiple outlets or a spray nozzle configured to spray cleaning liquid outwardly from the base 14 in front of the floor cleaner 10.

In the embodiment shown, the spray tips are provided on an interior or brush-facing side of the nozzle cover 92. The spray tips can be fed through channels of the nozzle cover 92 that terminate at connector ports 98 that couple with spray connectors 100 on the base housing 90 when the nozzle cover 92 is installed on the base housing 90. The spray connectors 100, in turn, are supplied with cleaning fluid via the pump 62 or other flow control system of the floor cleaner 10.

Optionally, a heater (not shown) can be provided for heating the cleaning liquid prior to delivering the cleaning liquid to the surface to be cleaned. In one example, an in-line heater can be located downstream of the supply tank 20, and upstream or downstream of the pump 62. Other types of heaters can also be used. In yet another example, the cleaning liquid can be heated using exhaust air from a motor cooling air path for the suction source 80 of the recovery system. In embodiments where the floor cleaner comprises a heater, the heater can be controlled via the brushroll detection mechanism 48 and/or the filter detection mechanism 52 as described above with reference to FIG. 1.

The brushroll 46 can be operably coupled to and driven by a drive assembly including the brushroll motor 60 in the base 14. The coupling between the brushroll 46 and the brushroll motor 60 can comprise one or more belts, gears, shafts, pulleys or combinations thereof. Alternatively, in other embodiments the vacuum motor 58 (FIG. 3) can be configured to provide both vacuum suction and brushroll rotation.

Referring to FIG. 3, the brushroll is positioned in brush chamber 94 and rotates in a direction R about brushroll axis 102. The base 14 can comprise an interference wiper 104 and/or a squeegee 106. The wiper 104 can be mounted at a forward portion of the brush chamber 94 and interfaces with a wetted portion of the rotating brushroll 46 to scrape excess liquid off before reaching the surface to be cleaned. The squeegee 106 can be disposed behind the brushroll 46 and contacts the surface as the base 14 to wipe residual liquid, thereby leaving a moisture and streak-free finish on the surface to be cleaned.

Figure 5:
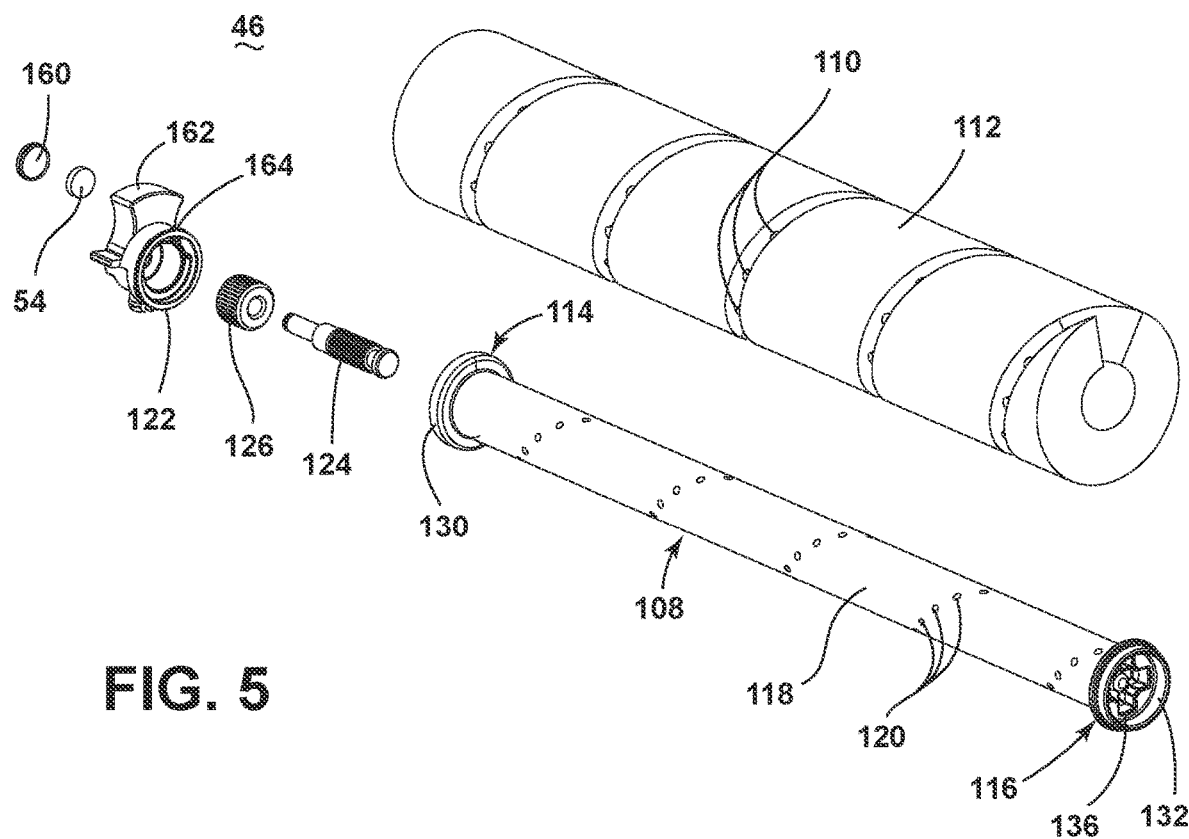
FIG. 5 is an exploded view of the brushroll.
Figure 6:
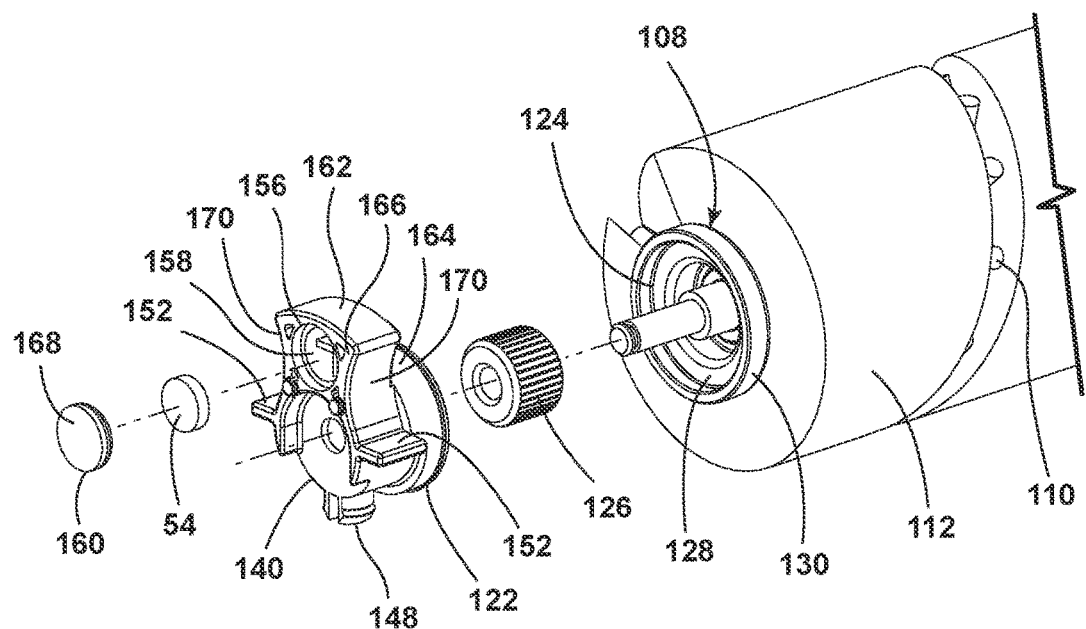
FIG. 6 is a close-up exploded view of one end of the brushroll, showing a detectable component on the brushroll.

Referring to FIGS. 5-6, one embodiment of the brushroll 46 including the detectable component, e.g. permanent magnet, is shown. The brushroll 46 can be a hybrid brushroll suitable for use on both hard and soft surfaces, and for wet or dry cleaning. In one embodiment, the brushroll 46 comprises a brush bar 108 supporting at least one agitation element.

The brushroll 46 includes a rotatable portion that is configured to rotate about the brushroll axis 102 and a stationary or non-rotatable portion that does not rotate about the brushroll axis 102. The brushroll axis 102 can be defined by the brush bar 108 and can extend longitudinally through a center of the brush bar 108. The rotatable portion includes at least the brush bar 108 and at least one agitation element.

The permanent magnet 54 is disposed on the non-rotatable portion of the brushroll 46, and can forms the detectable component of the brushroll sensing mechanism. In being disposed on a non-rotatable portion of the brushroll 46, the permanent magnet 54 is located in a section of the brushroll 46 that does not rotate during operation of the brushroll motor 60. Thus, the permanent magnet 54 does not move relative to the brushroll axis 102, but rather remains at a fixed point relative to the brushroll axis 102 and to the rotating brush bar 108.

The brush bar 108 has a first and second lateral ends 114, 116, and a cylindrical outer surface 118 extending from the first lateral end 114 to the second lateral end 116. The at least one agitation element generally projects outwardly form the outer surface 118 of the brush bar 108.

In one embodiment, the agitation element can comprise a plurality of bristles 110 and microfiber material 112 provided on the brush bar 108, with the microfiber material 112 arranged between the bristles 110.

Bristles 110 can be tufted or unitary bristle strips and constructed of nylon, or any other suitable synthetic or natural fiber. The brush bar 108 can have a plurality of radial bores 120 spaced along the length of the cylindrical outer surface 118 that receive tufts of bristles 110. The bores 120 may be arranged in one or more lines or rows. The bristles 110 may be arranged in any desirable pattern, such as helical, with the rows of bores 120 accordingly wrapping at least partially about the circumference of the cylindrical outer surface 118.

The microfiber material 112 can be constructed of polyester, polyamides, or a conjugation of materials including polypropylene or any other suitable material known in the art from which to construct microfiber.

The brush bar 108 can be constructed of a polymeric material such as acrylonitrile butadiene styrene (ABS), polypropylene or styrene, or any other suitable material such as plastic, wood, or metal. The brush bar 108 can have a solid core or a hollow core.

The non-rotatable portion of the brushroll 46 can comprise an end cap 122 disposed at one end of the brush bar 108. The end cap 122 is configured to mount one end of the brushroll 46 in the base 14, as described in further detail below.

To rotatably support the brushroll 46 in the base 14, the brushroll 46 can include an end assembly at the first lateral end 114 of the brush bar 108. The end assembly can, for example, include a stub shaft 124 extending from the first lateral end 114 of the brush bar 108 and a bearing 126 having an inner race press fitted on the stub shaft 124 and an outer race fixed in the end cap 122.

To accommodate the end cap 122 and the stub shaft 124, a cavity 128 may extend from the first lateral end 114 of the brush bar 108 laterally inwardly along the brushroll axis 102. The first lateral end 114 of the brush bar 108 may accordingly have an increased diameter for accommodating the end cap 122, with sufficient clearance for the brush bar 108 to rotate about the end cap 122.

The brushroll 46 can include a ferrule 130 on the first lateral end 114 of the brush bar 108 and the end cap 122 is inserted through the ferrule 130 into the cavity 128. Other configurations for insertion of the end cap 122 into the brush bar 108 are possible, including inserting the end cap 122 into a hole drilled or otherwise formed in the end of the brush bar 108. The ferrule 130 can be integrally molded with the brush bar 108, or can be formed separately and attached to the first lateral end 114 of the brush bar 108.

Referring to FIG. 4, the brushroll 46 can include a second or drive end cap 132 that couples with a drive assembly or transmission 134, which can comprise one or more belts, gears, shafts, pulleys or combinations thereof. The drive end cap 132 of the illustrated embodiment is integrally formed with the brush bar 108, although in other embodiments, the drive end cap 132 can be separate feature that is connected or joined to the brush bar 108. In any event, the drive end cap 132 and the brush bar 108 are formed or joined together such that upon drive input to the drive end cap 132, the brush bar 108 rotates. In being integrally formed, the drive end cap 132 and the brush bar 108 are be integrated into a single part both supporting the agitation element (e.g. bristles 110 and/or microfiber materials 112) and coupleable with the transmission 134.

In one embodiment, the drive end cap 132 can have a splined drive connection 136 with a drive head 138 of the transmission 134 operably connecting the brushroll motor 60 to the brushroll 46. The drive head 138 can be provided at an end of the brush chamber 94 opposite the end comprising the Hall Effect sensor 56. Other drive connections between the brushroll 46 and transmission 134 are possible.

Figure 7:
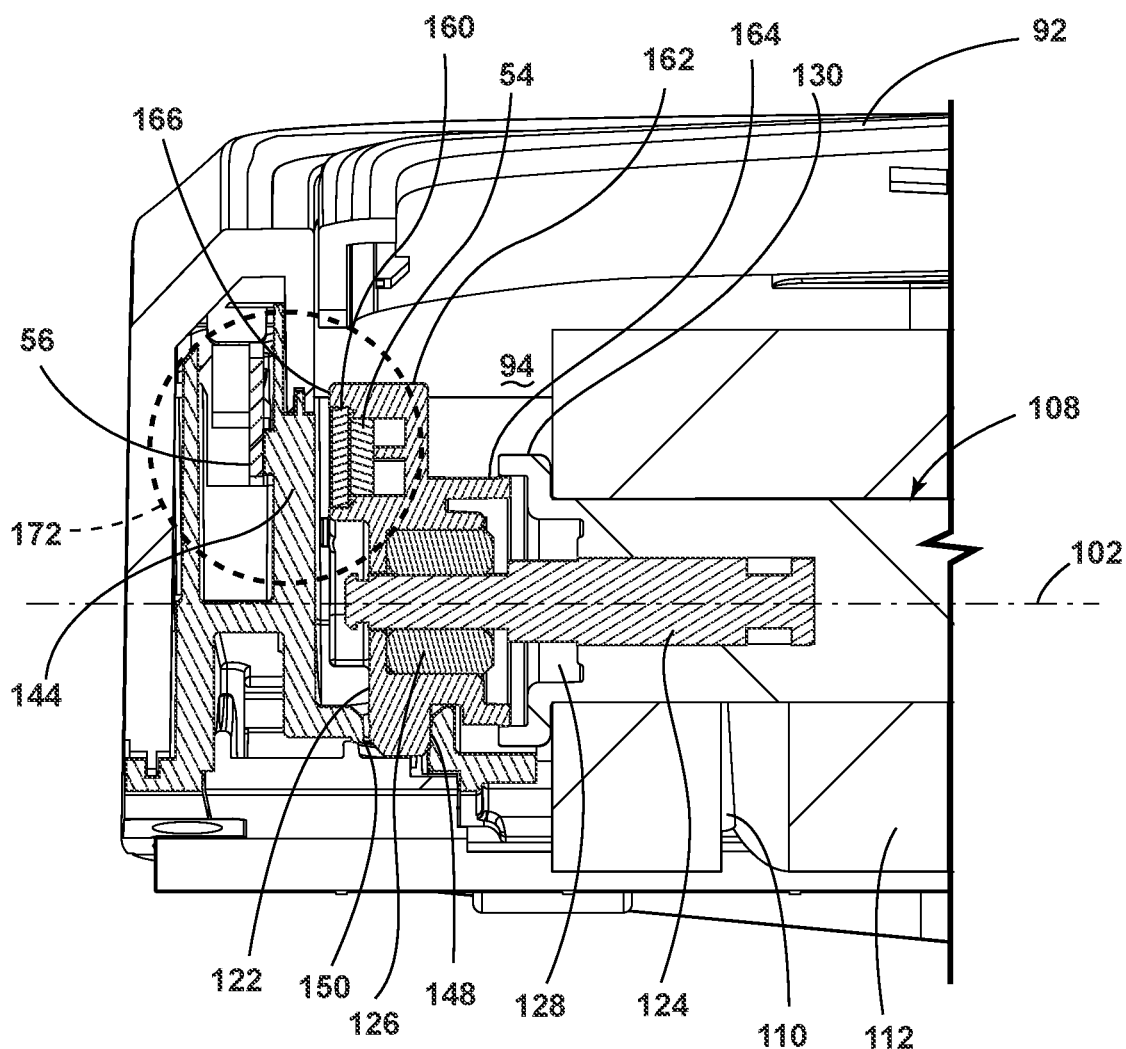
FIG. 7 is a close-up, cross-sectional view of the floor cleaner taken through line VII-VII of FIG. 2, showing details of a brushroll detection mechanism and the brushroll correctly installed on the floor cleaner.

Referring to FIGS. 4, 6, and 7, the brushroll 46 can be secured in the brush chamber 94 by a brushroll latch. Various configurations for the brushroll latch are possible. In the illustrated embodiment, a portion of the latch is provided on the end cap 122, with a mating portion provided in the brush chamber 94. Particularly, the end cap 122 can have a latch member 140 that is received by a latch receiver 142 in the brush chamber 94. The base housing 90 can include spaced first and second walls 144, 146 which at least partially define the brush chamber 94. The first and second walls 144, 146 can be lateral sidewalls that form a portion of the brush chamber 94 therebetween, such as by enclosing open lateral ends of the nozzle cover 92. The latch receiver 142 can be provided on an inner surface of the first wall 144.

The latch member 140 can be complementary to or keyed with the latch receiver 142 to ensure proper installation of the brushroll 46. In the illustrated embodiment, the latch member 140 and the latch receiver 142 can have complementary U-shapes and can optionally taper in the insertion direction of the brushroll 46, i.e. downwardly.

The latch member 140 can include a protruding part 148 that is snap fit with the latch receiver 142. In one embodiment, the protruding part 148 includes at least one, and optionally two, cantilever part having a hook, stud, lug, bead, or other engagement element at an end thereof. The protruding part 148 is deflected briefly during the joining operation and catches in a depression or undercut 150 in the latch receiver 142. The depression or undercut 150 is shaped to allow separation of the brushroll 46 from the base housing 90 upon application of sufficient force.

The end cap 122 and base housing 90 can include one or more additional mating surfaces or joints which help distribute the weight of the brushroll 46 supported by the first wall 144. In the illustrated embodiment, the end cap 122 can comprise outwardly extending tabs 152 that rest on shoulders 154 adjacent to the latch receiver 142.

As described above with reference to FIG. 1, the brushroll detection mechanism of the floor cleaner 10 allows operation of at least one electrically-powered component of the floor cleaner 10 when the permanent magnet 54 is detected by the Hall Effect sensor 56 and prevents operation of the at least one electrically-powered component when the permanent magnet 54 is not detected by the Hall Effect sensor 56.

The Hall Effect sensor 56 is provided at one end of the brush chamber 94 in a position to detect the permanent magnet 54 when the brushroll 46 is correctly installed in the brush chamber 94. The Hall Effect sensor 56 can be disposed on a side of the first wall 144 opposite the brush chamber 94, with the first wall 144 protecting the Hall Effect sensor 56 from exposure to dirt or liquid in the brush chamber 94. By providing the Hall Effect sensor 56 outside the brush chamber 94, the Hall Effect sensor 56 is less likely to become damaged or dirty. Other configurations and locations for mounting the Hall Effect sensor 56 on the base 14 are possible.

In the embodiment shown, the permanent magnet 54 is coupled to the end cap 122 forming a portion of the non-rotatable portion of the brushroll 46. A single permanent magnet 54 can be carried by the brushroll 46. A single permanent magnet 54 may be preferred in order to provide precise and accurate sensing by the Hall Effect sensor 56. In other embodiments, more than one permanent magnet 54 may be provided on the brushroll 46.

The permanent magnet 54 can be radially offset from the brushroll axis 102. In one embodiment, the permanent magnet 54 may be disposed at least partially outside the cylindrical outer surface 118 of the brush bar 108.

The end cap 122 can comprise a magnet holder 156 for the permanent magnet 54. The permanent magnet 54 can be press-fit or otherwise secured with the magnet holder 156. For example, an adhesive may be used to secure the permanent magnet 54 within the magnet holder 156.

The magnet holder 156 can comprise a recess 158 in the end cap 122, with the permanent magnet 54 at least partially received within the recess 158. In the embodiment shown, the permanent magnet 54 is disc-shaped, and the magnet holder 156 can comprise a circular recess for the disc-shaped magnet. Other shapes and configurations for the permanent magnet 54 and magnet holder 156 are possible.

A cover 160 can enclose the permanent magnet 54 within the recess 158. The cover 160 can be manufactured from a non-magnetic material, such as plastic or another suitable material. In other embodiments, the permanent magnet 54 may be uncovered. In this embodiment, the cover 160 is preferred as this protects permanent magnet 54 from exposure to dirt or liquid in the brush chamber 94, and from hair wrap.

A handle 162 to aid in removing the brushroll 46 from the brush chamber 94 can extending from the end cap 122. The brushroll removal handle 162 can project so that a user can grip the handle 162 to lift the brushroll 46 out of the brush chamber 94. For example, the handle 162 can be disposed on one side of the brushroll axis 102 and extends radially from an outer periphery 164 of the end cap 122, the outer periphery 164 of the end cap 122 circumscribing the brushroll axis 102.

In certain embodiments, the permanent magnet 54 can be disposed on the handle 162. For example, the magnet holder 156 can be formed or otherwise joined with the handle 162.

In the illustrated embodiment, the magnet holder 156 comprises the recess 158 integrally formed in an outboard surface 166 of the handle 162. In other embodiments, the magnet holder 156 may be secured directly to the outboard surface 166 of the handle 162. The outboard surface 166 is a surface of the handle 162 outside or away from the center of the brushroll 46, e.g. a surface that faces the end of the brush chamber 94. The outboard surface 166 can confront the first wall 144 of the brush chamber 94.

An outboard surface 168 of the cover 160 may be flush with the outboard surface 166 of the handle 162, or the cover 160 be slightly recessed with respect to the handle 162. Such configurations may be preferred over a configuration where the cover 160 protrudes beyond the outboard surface 166 of the handle 162 because the handle 162 can be fit tightly against with the first wall 144 of the brush chamber 94, reducing the chance for dirt or hair to migrate in-between the handle 162 and the first wall 144.

The handle 162 can optionally include indents 170 in the sides of the handle 162 to assist in gripping the handle 162 to lift the brushroll 46. The indents 170 can, for example, by pinched between the thumb and forefinger of the user. The outboard surface 166 of the handle 162 in which the permanent magnet 54 is recessed can extend between the sides of the handle 162 comprising the indents 170.

Referring to FIG. 7, when the brushroll 46 is correctly installed in the brush chamber 94 and the nozzle cover 92 is coupled with the base housing 90, the handle 162, and therefore the permanent magnet 54 and magnet cover 160, are covered by the nozzle cover 92. This can protect these components and prevent unintended release of the brushroll 46 during a cleaning operation, which would inadvertently trigger the brushroll detection mechanism to turn off one or more electrically-powered components of the floor cleaner 10.

The latching of the brushroll 46 further locks the positon of the permanent magnet 54 in place relative to the Hall Effect sensor 56. With the end cap 122 blocked from shifting upwardly or downwardly, or forwardly or rearwardly, by receipt of the latch member 140 within the latch receiver 142, the permanent magnet 54 likewise will not shift relative to the sensor Hall Effect sensor 56, such that the permanent magnet 54 can be reliably detected as the brush bar 108 rotates and the floor cleaner 10 is moved about the surface to be cleaned.

Figure 8:
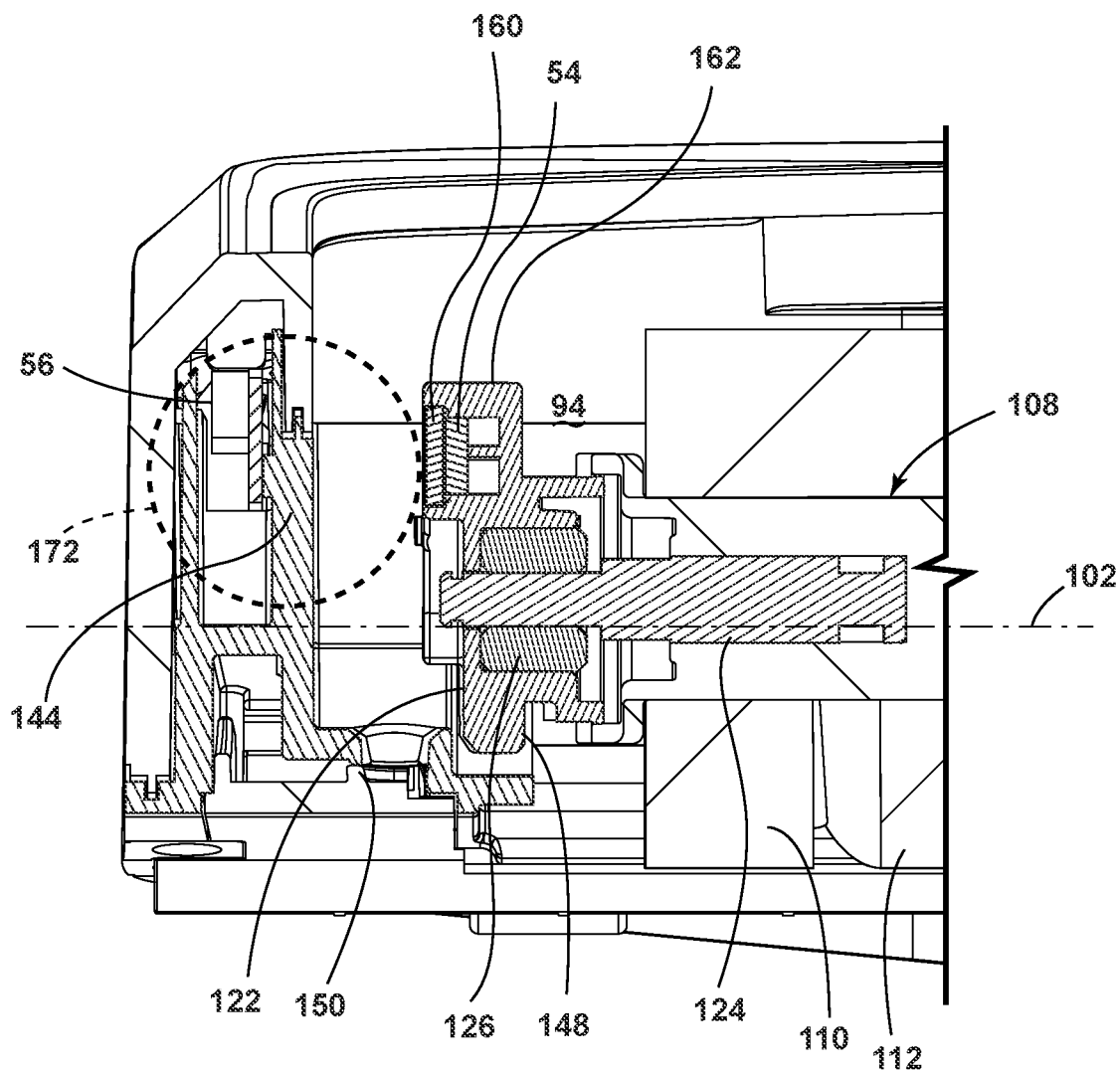
FIG. 8 is a view similar to FIG. 7, showing the brushroll incorrectly installed on the floor cleaner.
Figure 9:
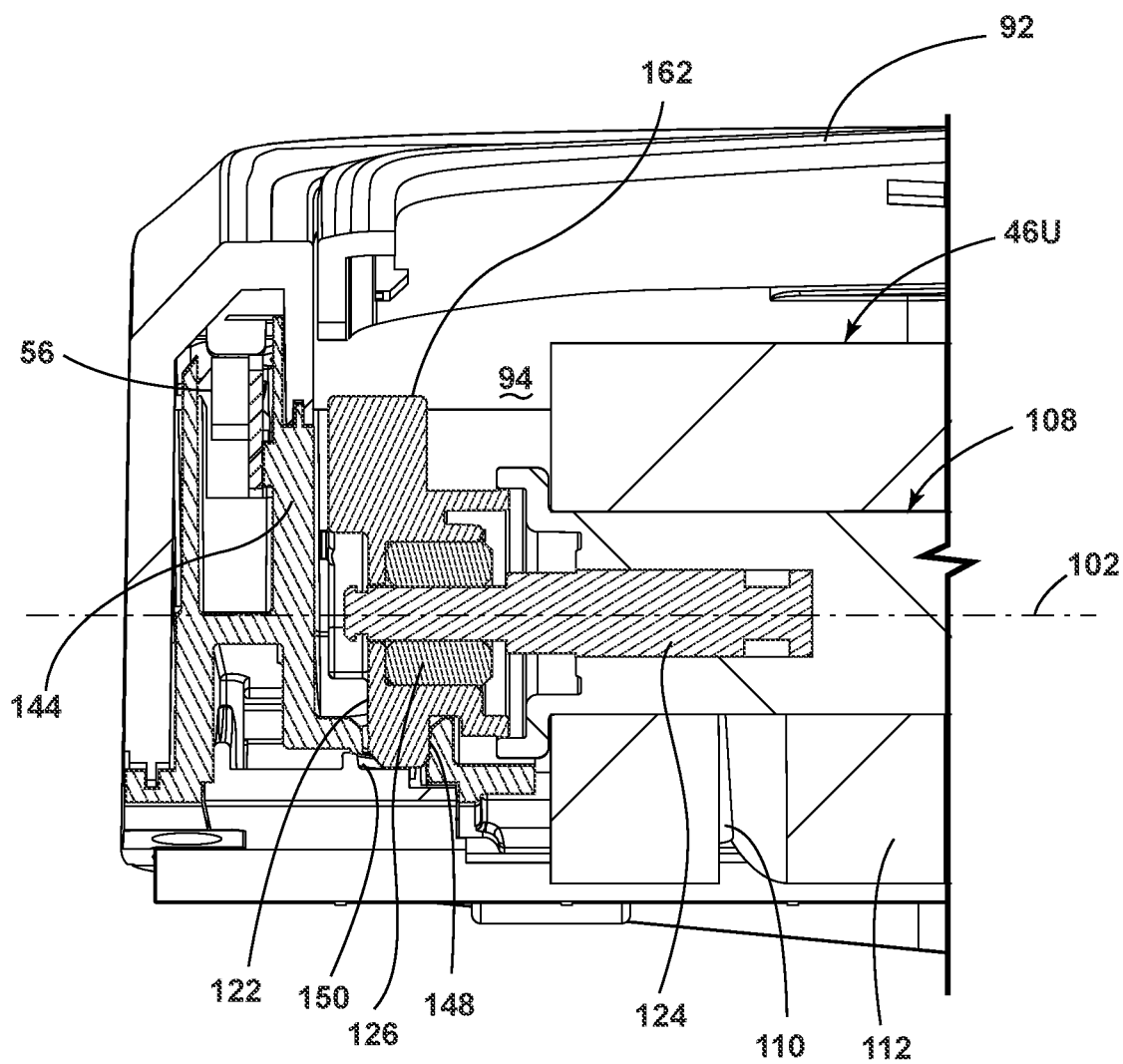
FIG. 9 is a view similar to FIG. 7, showing an unauthorized brushroll installed on the floor cleaner.

Referring to FIGS. 7-9, the permanent magnet 54 is configured to be detected by the Hall Effect sensor 56 within an effective sensing zone 172 of the sensor 56. Direct physical contact between the permanent magnet 54 and sensor 56 is not required, as the effective sensing zone 172 can detect the permanent magnet 54 within a predetermined distance away from the Hall Effect sensor 56. One non-limiting example of the effective sensing zone 172 is indicated in phantom line in FIGS. 7-9, although it is understood that other ranges for the effective sensing zone 172 are possible.

FIG. 7 shows one example of the brushroll 46 installed correctly on the floor cleaner 10. In this condition, the permanent magnet 54 is within the effective sensing zone 172 of the Hall Effect sensor 56. During installation of the brushroll 46 on the floor cleaner 10, as the brushroll 46 brought into the mounted position within the brush chamber 94, the permanent magnet 54 moves toward and eventually interacts with the Hall Effect sensor 56. Interaction of the permanent magnet 54 with the Hall Effect sensor 56 allows at least one component of the floor cleaner 10 (i.e., the vacuum motor 58, brushroll motor 60, pump 62, etc., or any combination thereof) to operate.

FIG. 8 shows one example of the brushroll 46 installed incorrectly on the floor cleaner 10. In this condition, the permanent magnet 54 is outside the effective sensing zone 172 of the Hall Effect sensor 56. Lack of interaction of the permanent magnet 54 with the Hall Effect sensor 56 prevents at least one component of the floor cleaner 10 (i.e., the vacuum motor 58, brushroll motor 60, pump 62, etc., or any combination thereof) from operating.

FIG. 9 shows one example of a brushroll 46U installed correctly on the floor cleaner 10, where the brushroll 46U lacks a permanent magnet 54 or other detectable component. In this condition, no magnet or other detectable component is within the effective sensing zone 172 of the Hall Effect sensor 56. Lack of interaction of any magnet or other detectable component with the Hall Effect sensor 56 prevents at least one component of the floor cleaner 10 (i.e., the vacuum motor 58, brushroll motor 60, pump 62, etc., or any combination thereof) from operating.

Other embodiments of brushrolls 46 are possible, including a bristle-only brushroll suitable for use on soft surfaces, and having bristles 110 as the only agitation element, or a microfiber-only brushroll suitable for use on hard surfaces and having microfiber material 112 as the only agitation element. Each of these brushrolls can comprise a permanent magnet 54 as described herein.

Optionally, the floor cleaner 10 can be provided with multiple, interchangeable brushrolls, which allows for the selection of a brushroll depending on the cleaning task to be performed or depending on the floor type of be cleaned. Yet another advantage of having multiple, interchangeable brushrolls is that cleaning time can be extended by allowing a soiled brushroll to be swapped out for a clean brushroll during a cleaning task.

Figure 10:
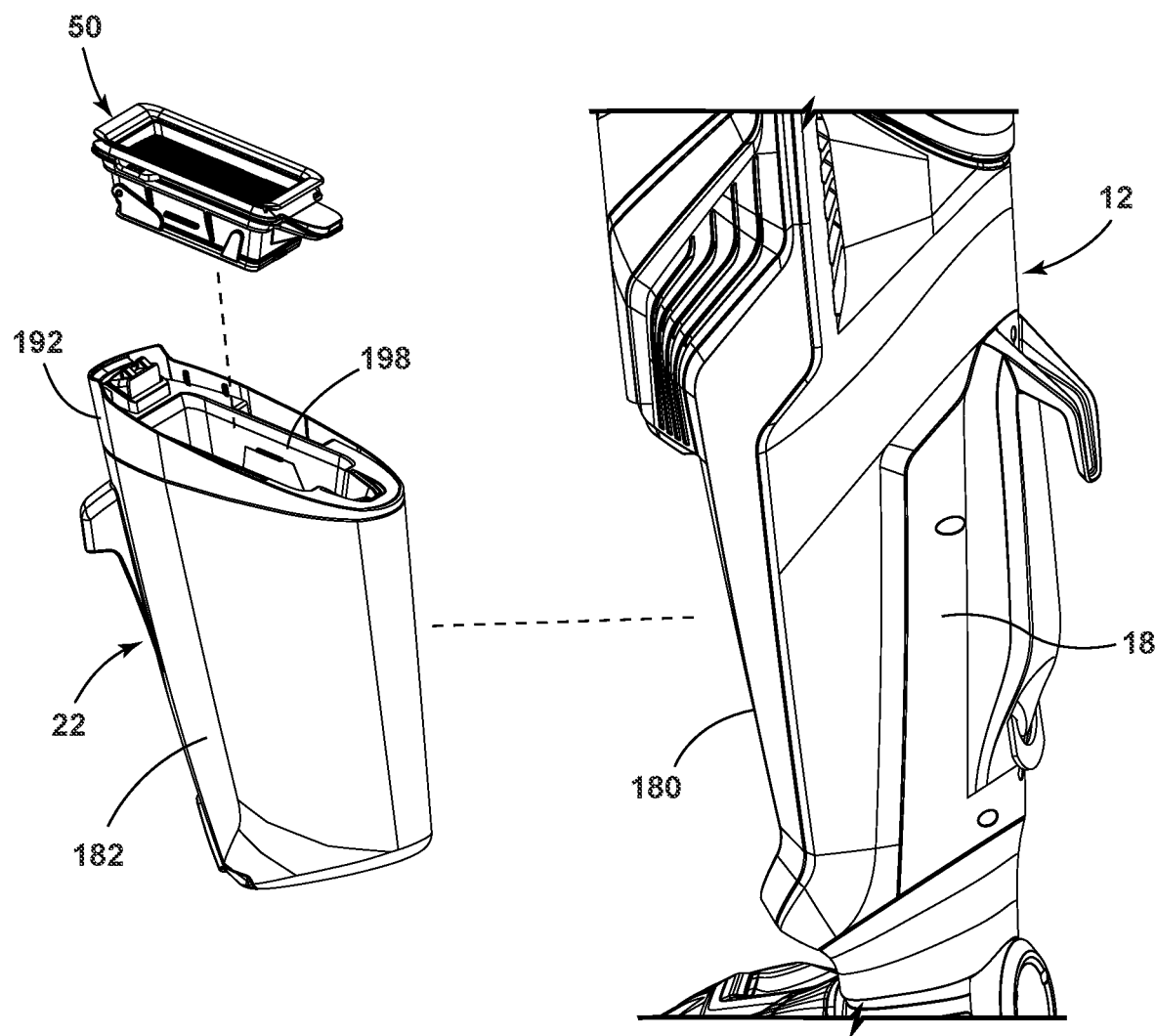
FIG. 10 is an rear perspective view of the floor cleaner showing a recovery tank and filter assembly removed from an upright body of the floor cleaner.

Referring to FIG. 10, the upright body 12 can include a tank socket or receiver 180 for receiving the recovery tank 22. As shown herein, in one embodiment the tank receiver 180 can be defined by portions of the frame 18. A recovery tank latch (not shown) can secure the recovery tank 22 to the upright body 12 within the tank receiver 180.

Figure 11:
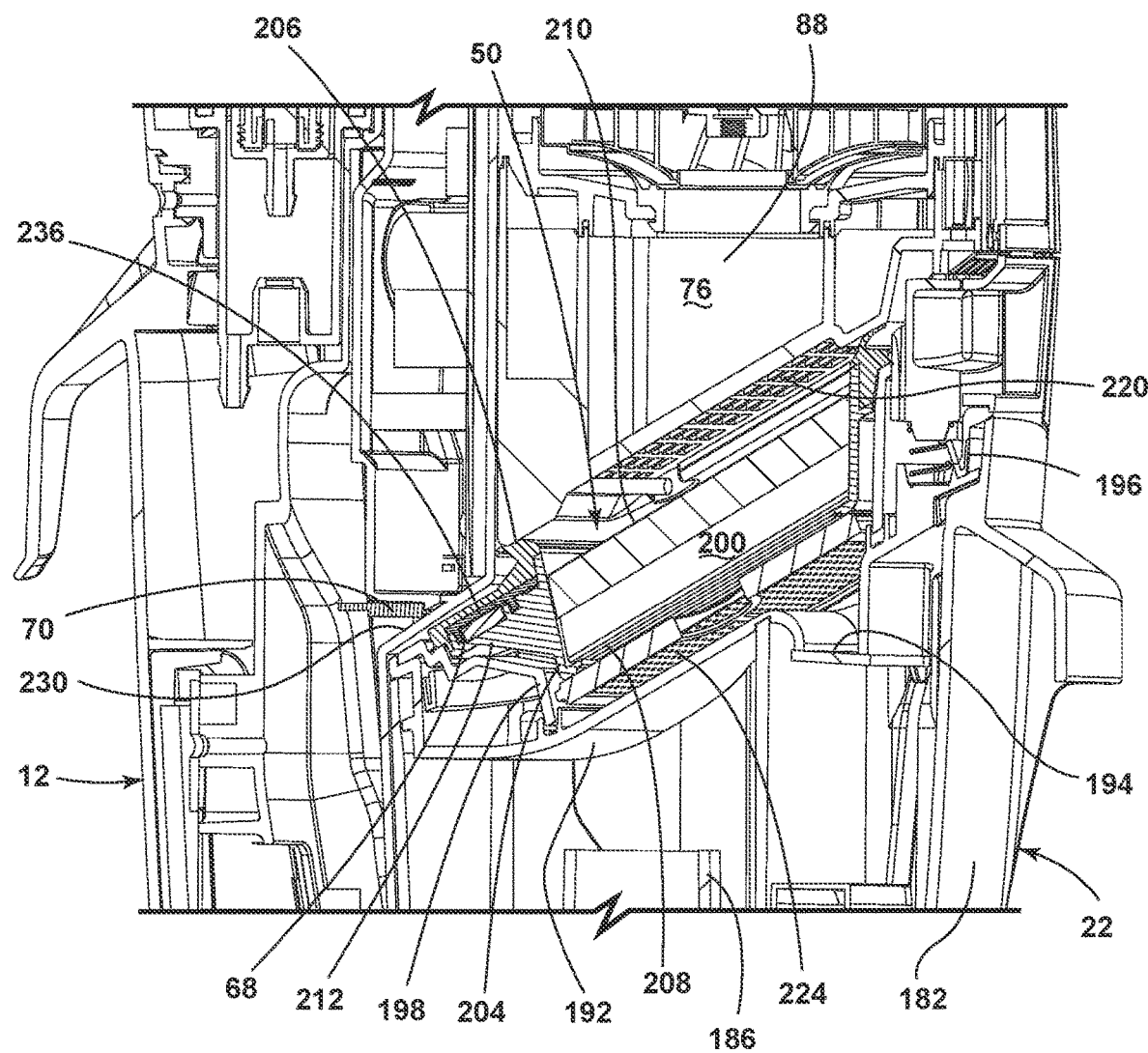
FIG. 11 is a close-up, perspective view showing the filter assembly and details of a filter detection mechanism.

Referring to FIGS. 3, 10, and 11, the recovery tank 22 can include a recovery tank container 182, which forms a collection chamber 184 for the recovery system, with a hollow standpipe 186 therein. The standpipe 186 forms a flow path between a tank inlet 188 formed at a lower end of the recovery tank container 182 and a tank outlet 190 at the upper end of the standpipe 186 within the interior of the recovery tank container 182. When the recovery tank 22 is mounted to the frame 18 as shown in FIG. 3, the tank inlet 188 is aligned with the conduit 84 to establish fluid communication between the base 14 and the recovery tank 22.

The recovery tank 22 further includes a lid 192 sized for receipt on the recovery tank container 182. The lid 192 at least partially encloses an open top of the recovery tank container 182, and can further define an air outlet 194 of the recovery tank 22 leading to the downstream suction source 80 (FIG. 3). A gasket 196 can be positioned between mating surfaces of the lid 192 and the recovery tank container 182, and creates a seal therebetween for prevention of leaks.

The filter assembly 50 can be carried by the recovery tank 22, and therefore is removable from the floor cleaner 10 upon removal of the recovery tank 22 and is installable on the floor cleaner upon mounting of the recovery tank 22 in the tank receiver 180. In the illustrated embodiment, the filter assembly 50 can be supported by the lid 192, and the lid 192 can include a filter receiver 198 on an upwardly facing side thereof that is sized to receive the filter assembly 50. The filter assembly 50 is removably mounted in the filter receiver 198. In other embodiments, the filter assembly 50 can be separate from the recovery tank 22, and is removable and installable independently of the tank.

Figure 12:
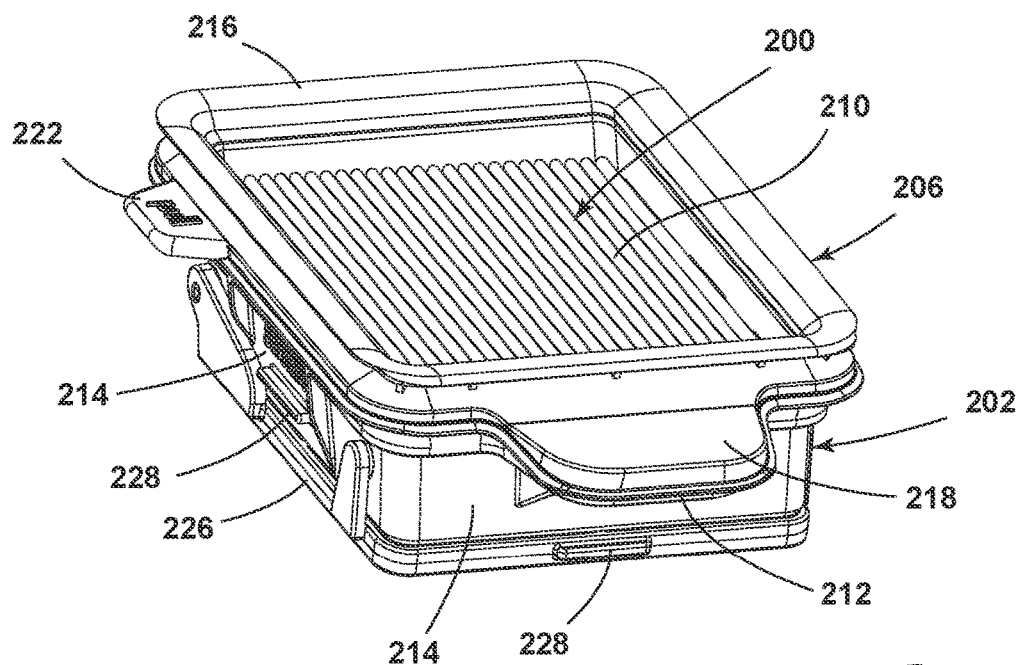
FIG. 12 is a perspective view of the filter assembly.
Figure 13:
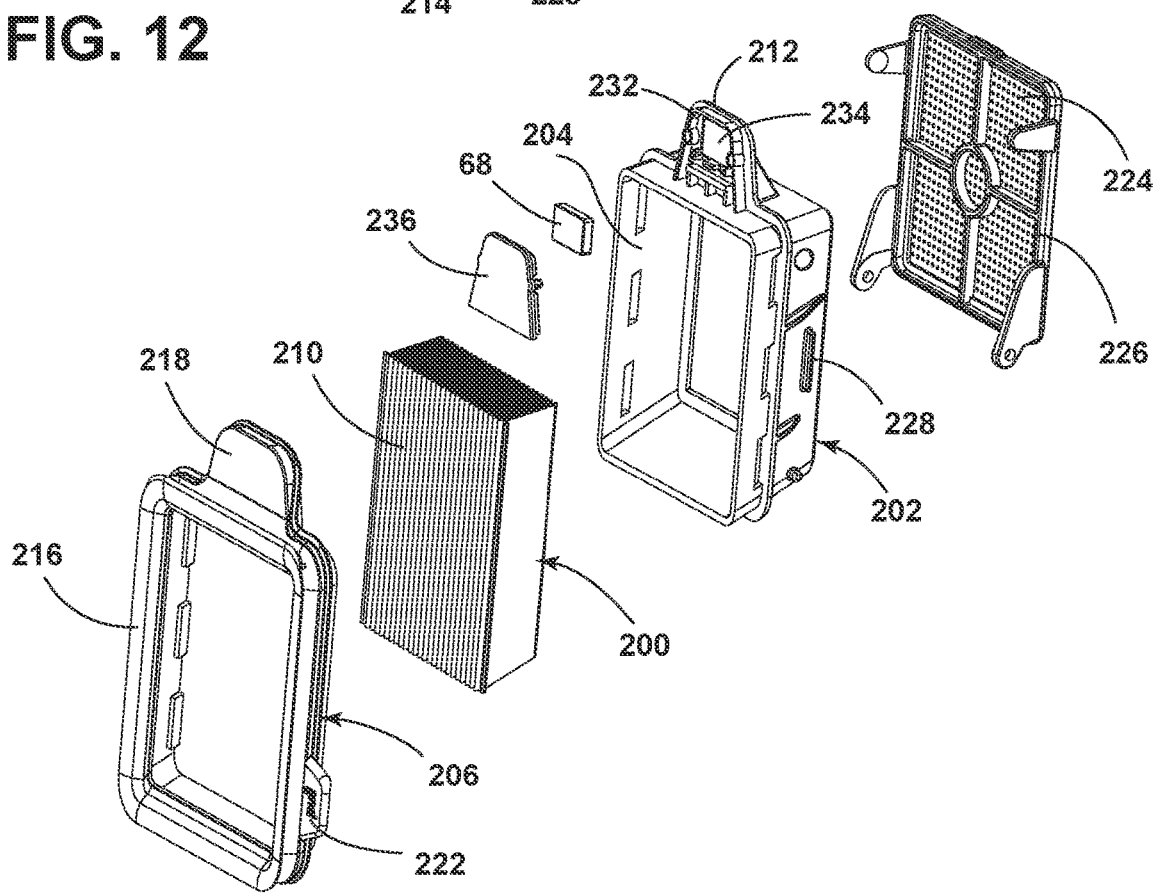
FIG. 13 is an exploded view of the filter assembly.

Referring to FIGS. 12-13, one embodiment of the filter assembly 50 including the detectable component, e.g. permanent magnet, is shown. The filter assembly 50 can include a filter 200 and a filter housing 202 including a frame 204 having an open area through which air may pass, the filter 200 supported within the frame 204. A seal 206 on the filter housing 202 blocks the escape of air from the working air path or recovery pathway 76. The filter 200 has an intake side 208 and an exhaust side 210, and the seal 206 can extend around the exhaust side 210 of the filter 200. The filter assembly 50 can have a handle 212 or other gripping feature that is made to be grasped or held by the hand for easy removal of the filter assembly 50. The permanent magnet 68 can be disposed on the handle 212 or on another portion of the filter housing 202.

The intake side 208 of the filter 200 is an upstream side that faces the air outlet 194 of the recovery tank 22. The exhaust side 210 of the filter 200 is a downstream side that generally opposes the upstream side relative to the direction of airflow through the recovery pathway 76. Air therefore flows into the filter 200 through the intake side 208 and out of the filter 200 through the exhaust side 210.

The filter 200 can comprise any suitable type or combination of types of filter media suitable for filtering particles entrained within an airstream. Non-limiting examples of filter media include paper, cellulosic material, non-woven material, spunbond material, pleated filter media, open cell foam, polyester type matrix (e.g., polyethylene terephthalate), and combinations thereof. The filter media can also be a reusable or washable type of media such as a non-woven or foam type filter media, for example. It will be understood that the particle filtration size of the filter will vary depending on the floor cleaner 10 in which the filter assembly 50 is intended for use. For the embodiment of the multi-surface wet/dry floor cleaner 10 shown, the filter 200 is a pleated filter, and can be made of a material that remains porous when wet, e.g., air can still flow through the filter 200 when wet (unlike conventional paper filters).

The filter 200 can be secured within the filter housing 202 using any suitable securement method. For example, adhesive may be applied between the filter 200 and the frame 204. The filter hosing 202 and frame 204 can be made from a more rigid material than the filter 200 to provide stiffness to the filter assembly 50.

The frame 204 of the filter housing 202 includes at least one peripheral side wall 214 defining the open area through which air may pass and in which the filter 200 is situated. In the embodiment shown, the frame 204 is rectilinear and comprises four walls 214. While the frame 204 is shown as rectilinear, the frame 204 may have different geometric shapes to suit the cross-sectional area in which the filter assembly 50 may be mounted. It will be understood that the dimensions of the filter assembly 50 will vary depending on the floor cleaner 10 in which the filter assembly 50 is intended for use.

The seal 206 can include a perimeter seal portion 216 surrounding the exhaust side 210 of the filter 200. The permanent magnet 68 can be disposed outward of the perimeter seal portion 216, such that the permanent magnet 68 is disposed outside the recovery pathway 76 of the floor cleaner 10.

In certain embodiments, the seal 206 can extend at least partially over the handle 212 and can overlie the permanent magnet 68. In this case, the seal 206 can include a handle seal portion 218 extending from the perimeter seal portion 216 at least partially over the handle 212.

The seal 206 can be overmolded or otherwise secured on the filter housing 202. For example, the seal 206 can be formed separately and attached to the filter housing 202 using an adhesive. For an overmolded seal 206, the seal 206 may be made from any material that can be suitable bonded to the material of the filter housing 202. In one non-limiting example, the seal 206 can be made from a thermoplastic elastomer and the filter housing 202 can be polypropylene.

Referring to FIG. 11, a ceiling of the tank receiver 180 can be configured to fit tightly against the seal 206, and optionally also with the lid 192 the recovery tank 22, to provide a sealed pathway from the filter assembly 50 to the suction source 80 (FIG. 4), and the tank receiver 180 can include a grille 220 through which air can pass to the chamber 88. The seal 206 may be compressed when the recovery tank 22 is installed on the tank receiver 180.

The handle 212 can aid in removing the filter assembly 50 from the filter receiver 198, and can extend from one of the walls 214 of the frame 204. The handle 212 can project so that a user can grip the handle 212 to lift the filter assembly 50 out of the filter receiver 198.

Returning to FIGS. 12-13, a pull tab 222 can project from one of the walls 214 of the frame 204, preferably from a different wall 214 than the handle 212. The pull tab 222 can assist the user in lifting the filter assembly 50 out of the filter receiver 198. In other embodiments, the pull tab 222 may be eliminated, and the filter assembly 50 may be liftable out of the filter receiver 198 via the handle 212 alone.

In certain embodiments, the filter assembly 50 may comprise at least one additional filter media upstream of the filter 200. In the depicted embodiment, a mesh screen 224 is disposed on the intake side 208 of the filter 200 and is coupled with the filter housing 202. The mesh screen 224 has a larger pore size than the filter 200. When referring to the filter 200 or mesh screen 224, the pore size is the size of the largest particles that can successfully pass through that element. The pore size may be an effective pore size or an average of pore sizes across the media. It is contemplated that by providing multiple filtration media, e.g. the mesh screen 224 and the filter 200, of decreasing pore size to sequentially filter larger and then smaller particulate, the finer filter 200 is prevented from becoming obstructed with larger debris.

The filter assembly 50 can include a door 226 pivotally coupled with the filter housing 202, the door 226 having an open grid and the mesh screen 224 covering the open grid. The door 226 can swing open, e.g. away from the intake side 208 of the filter 200, to clean the mesh screen 224 and filter 200.

The filter assembly 50 can have a poka-yoke installation to prevent a user from inadvertent error in installing the filter assembly 50 on the recovery tank 22. In one embodiment, the poka-yoke installation includes at least one projecting feature 228 on the filter assembly 50 and/or on the filter receiver 198 that prevents a user from installing the filter assembly 50 incorrectly by interfering with the insertion of the filter assembly 50 into the filter receiver 198.

As described above with reference to FIG. 1, the filter detection mechanism of the floor cleaner 10 allows operation of at least one electrically-powered component of the floor cleaner 10 when the permanent magnet 68 is detected by the Hall Effect sensor 70 and prevents operation of the at least one electrically-powered component when the permanent magnet 68 is not detected by the Hall Effect sensor 70.

The Hall Effect sensor 70 is provided at one side of the tank receiver 180 in a position to detect the permanent magnet 68 when the filter assembly 50 is correctly installed in the floor cleaner 10, with the filter 200 located in the recovery pathway 76. The Hall Effect sensor 70 can be disposed behind a wall 230 delimiting the tank receiver 180, the recovery tank 22 removably mounted on an opposite side of the wall 230. The wall 230 therefore protects the Hall Effect sensor 70 from exposure to the working air flow. By providing the Hall Effect sensor 70 outside the recovery pathway 76, the Hall Effect sensor 70 is less likely to become damaged or dirty. In other embodiments, the Hall Effect sensor 70 may be provided elsewhere on the floor cleaner 10, for example, adjacent to a filter receiver for the filter assembly 50 in a position to detect the permanent magnet 68 when the filter assembly 50 is correctly installed in the floor cleaner 10.

In the embodiment shown, the permanent magnet 68 is coupled to the handle 212. A single permanent magnet 68 can be carried by the filter assembly 50. A single permanent magnet 68 may be preferred in order to provide precise and accurate sensing by the Hall Effect sensor 70. In other embodiments, more than one permanent magnet 68 may be provided on the filter assembly 50.

The handle 212 can be located outside the air flow pathway or recovery pathway 76, with the seal 206 blocking off the handle 212 from exposure to the working air flow. As the permanent magnet 68 is disposed on the handle 212, the permanent magnet 68 is thus located outside the recovery pathway 76 and is protected from exposure to the working air flow. By providing the permanent magnet 68 outside the recovery pathway 76, the permanent magnet 68 is less likely to become damaged or dirty.

The handle 212 can comprise a magnet holder 232 for the permanent magnet 68. The permanent magnet 68 can be press-fit or otherwise secured with the magnet holder 232. For example, an adhesive may be used to secure the permanent magnet 68 within the magnet holder 232.

The magnet holder 232 can comprise a recess 234 having an opening in a side of the handle 212, with the permanent magnet 68 at least partially received within the recess 234. The opening of the recess 234 can be disposed toward the exhaust side 210 of the filter 200.

In the embodiment shown, the permanent magnet 68 is rectangular, and the magnet holder 232 can comprise a rectangular recess 234 for the rectangular permanent magnet 68. Other shapes and configurations for the permanent magnet 68 and magnet holder 232 are possible.

A cover 236 can enclose the permanent magnet 68 within the recess 234. The cover 236 can be manufactured from a non-magnetic material, such as plastic or another suitable material. In other embodiments, the permanent magnet 68 may be uncovered. In this embodiment, the cover 236 is preferred as this permits the seal 206 to be overmolded onto the cover 236, and the cover 236 to be hidden by the handle seal portion 218 of the seal 206.

Figure 14:
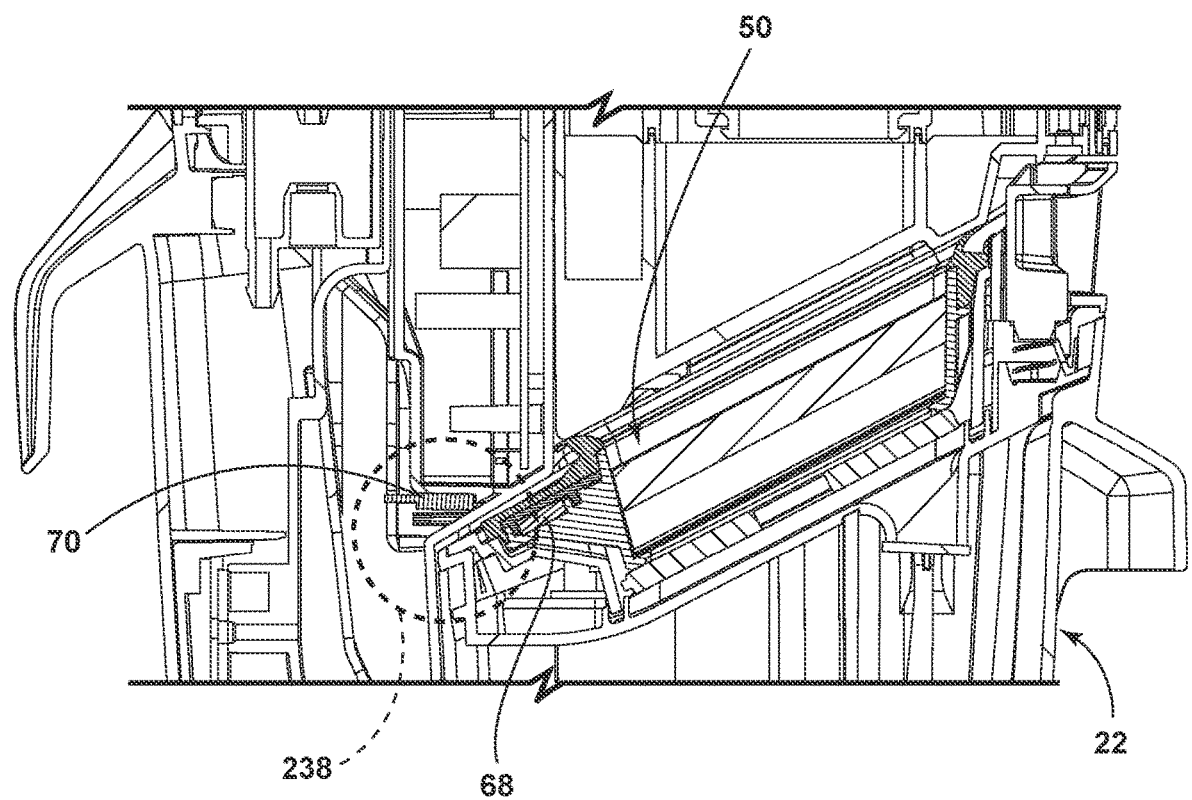
FIG. 14 is a close-up, cross-sectional view of the floor cleaner taken through line XIV-XIV of FIG. 2, showing details of the filter detection mechanism and the filter assembly correctly installed on the floor cleaner.
Figure 15:
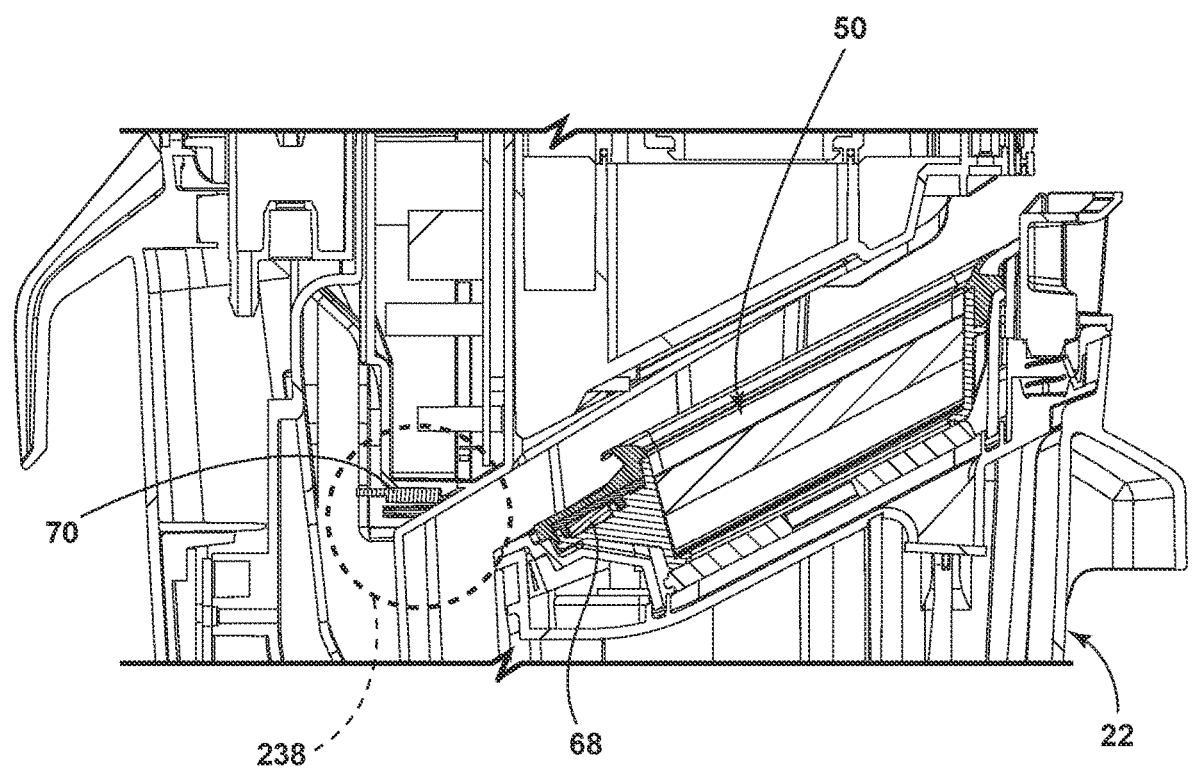
FIG. 15 is a view similar to FIG. 14, showing the filter assembly incorrectly installed on the floor cleaner.
Figure 16:
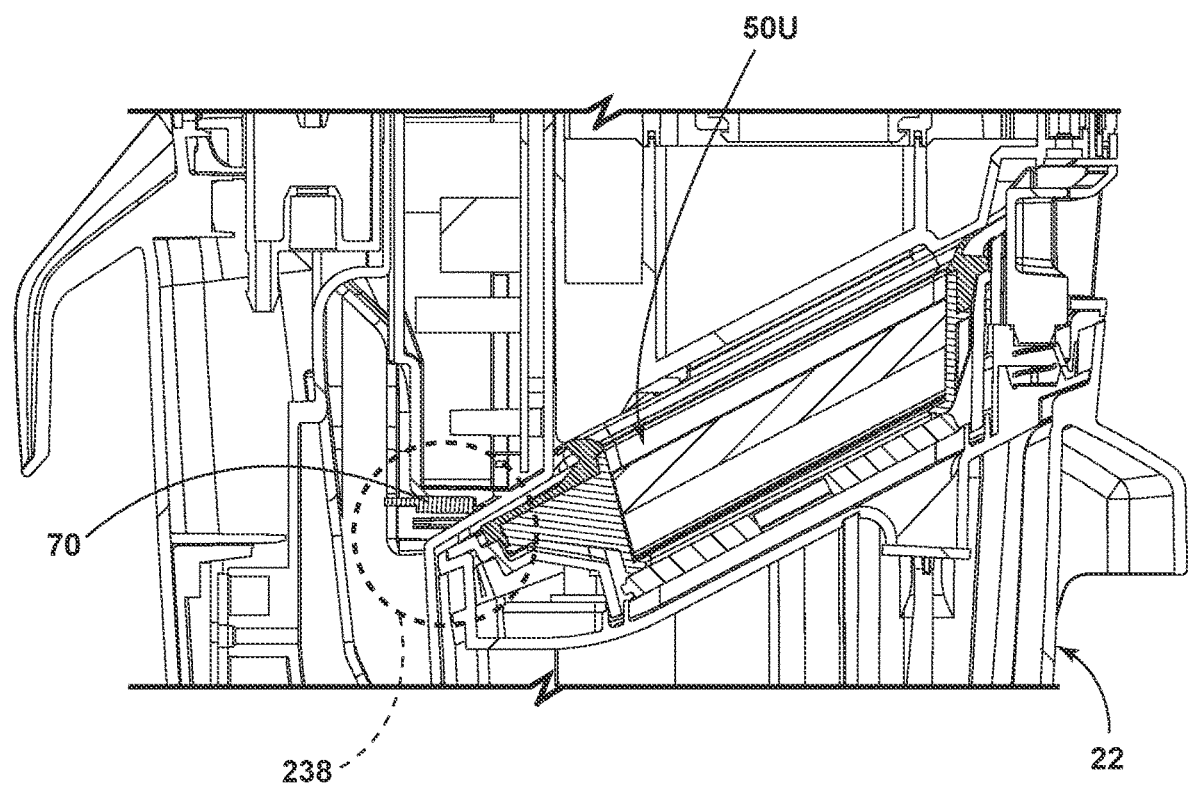
FIG. 16 is a view similar to FIG. 14, showing an unauthorized filter assembly installed on the floor cleaner.

Referring to FIGS. 14-16, the permanent magnet 68 is configured to be detected by the Hall Effect sensor 70 within an effective sensing zone 238 of the Hall Effect sensor 70. Direct physical contact between the permanent magnet 68 and Hall Effect sensor 70 is not required, as the effective sensing zone 238 can detect the permanent magnet 68 within a predetermined distance away from the Hall Effect sensor 70. One non-limiting example of the effective sensing zone 238 is indicated in phantom line in FIGS. 14-16, although it is understood that other ranges for the effective sensing zone 238 are possible.

FIG. 14 shows one example of the filter assembly 50 installed correctly on the floor cleaner 10. In this condition, the permanent magnet 68 is within the effective sensing zone 238 of the Hall Effect sensor 70. During installation of the recovery tank 22 on the floor cleaner 10, as the recovery tank 22 brought into the mounted position within the tank receiver 180, the permanent magnet 68 on the filter assembly 50 moves toward and eventually interacts with the Hall Effect sensor 70. Interaction of the permanent magnet 68 with the Hall Effect sensor 70 allows at least one component of the floor cleaner 10 (i.e., the vacuum motor 58, brushroll motor 60, pump 62, etc., or any combination thereof) to operate.

FIG. 15 shows one example of the filter assembly 50 installed incorrectly on the floor cleaner 10. In this condition, the permanent magnet 68 is outside the effective sensing zone 238 of the Hall Effect sensor 70. Lack of interaction of the permanent magnet 68 with the Hall Effect sensor 70 prevents at least one component of the floor cleaner 10 (i.e., the vacuum motor 58, brushroll motor 60, pump 62, etc., or any combination thereof) from operating.

FIG. 16 shows one example of a filter assembly 50U installed correctly on the floor cleaner 10, where the filter assembly 50U lacks a permanent magnet 68 or other detectable component. In this condition, no magnet or other detectable component is within the effective sensing zone 238 of the Hall Effect sensor 70. Lack of interaction of any magnet or other detectable component prevents at least one component of the floor cleaner 10 (i.e., the vacuum motor 58, brushroll motor 60, pump 62, etc., or any combination thereof) from operating.

To the extent not already described, the different features and structures of the various embodiments of the invention, may be used in combination with each other as desired, or may be used separately. That one floor cleaner is illustrated herein as having all of these features does not mean that all of these features must be used in combination, but rather done so here for brevity of description. Furthermore, while the floor cleaner 10 shown herein has an upright configuration, the floor cleaner can be configured as a canister or portable unit. For example, in a canister arrangement, foot components such as the suction nozzle and brushroll can be provided on a cleaning head coupled with a canister unit. Still further, the floor cleaner can additionally have steam delivery capability. Thus, the various features of the different embodiments may be mixed and matched in various vacuum cleaner configurations as desired to form new embodiments, whether or not the new embodiments are expressly described.

The above description relates to general and specific embodiments of the disclosure. However, various alterations and changes can be made without departing from the spirit and broader aspects of the disclosure as defined in the appended claims, which are to be interpreted in accordance with the principles of patent law including the doctrine of equivalents. As such, this disclosure is presented for illustrative purposes and should not be interpreted as an exhaustive description of all embodiments of the disclosure or to limit the scope of the claims to the specific elements illustrated or described in connection with these embodiments. Any reference to elements in the singular, for example, using the articles "a," "an," "the," or "said," is not to be construed as limiting the element to the singular.

Likewise, it is also to be understood that the appended claims are not limited to express and particular compounds, compositions, or methods described in the detailed description, which may vary between particular embodiments that fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

The invention claimed is:

1. A filter assembly for a floor cleaner for cleaning a floor surface, comprising:
    a filter having an intake side and an exhaust side;
    a filter housing comprising a frame having an open area through which air may pass, the filter supported within the frame;
    a mesh screen on the intake side of the filter, the mesh screen having a pore size configured to filter a larger particle size than the filter;
    a door pivotally coupled with the filter housing, the door having an open grid and the mesh screen covering the open grid;
    a seal on the filter housing, the seal extending around the exhaust side of the filter;
    a handle projecting from the filter housing; and
    a permanent magnet disposed on the handle.

2. The filter assembly of claim 1, wherein the filter comprises a pleated filter media that remains porous when wetted by water.

3. The filter assembly of claim 1, wherein the seal extends at least partially over the handle and overlies the permanent magnet.

4. The filter assembly of claim 1, wherein the filter housing comprises a peripheral side wall and at least one projecting feature projecting generally orthogonally from an outer surface of the peripheral side wall.

5. The filter assembly of claim 1, wherein the frame is rectilinear and comprises four walls, and the handle projects from a first one of the four walls.

6. The filter assembly of claim 5, comprising a pull tab projecting from a second one of the four walls.

7. The filter assembly of claim 1, wherein the seal is overmolded on the filter housing and extends at least partially over the handle to overlie the permanent magnet.

8. A filter assembly for a floor cleaner for cleaning a floor surface, comprising:
    a filter having an intake side and an exhaust side;
    a filter housing comprising a frame having an open area through which air may pass, the filter supported within the frame;
    a seal on the filter housing, the seal extending around the exhaust side of the filter;
    a handle projecting from the filter housing; and
    a permanent magnet disposed on the handle;
    wherein the handle comprises:
        a recess having an opening in a side of the handle, the permanent magnet disposed in the recess; and
        a plastic cover closing the opening and enclosing the permanent magnet in the recess.

9. The filter assembly of claim 8, comprising a mesh screen on the intake side of the filter, the mesh screen having a pore size configured to filter a larger particle size than the filter.

10. The filter assembly of claim 9, comprising a door pivotally coupled with the filter housing, the door having an open grid and the mesh screen covering the open grid.

11. The filter assembly of claim 8, wherein the seal extends over the plastic cover.

12. The filter assembly of claim 8, wherein the permanent magnet is press-fit within the recess.

13. The filter assembly of claim 8, wherein the opening of the recess is disposed toward the exhaust side of the filter.

14. A filter assembly for a floor cleaner for cleaning a floor surface, comprising:
    a filter having an intake side and an exhaust side;
    a filter housing comprising a frame having an open area through which air may pass, the filter supported within the frame;
    a seal on the filter housing, the seal extending around the exhaust side of the filter;
    a handle projecting from the filter housing; and
    a permanent magnet disposed on the handle;
    wherein the seal comprises a perimeter seal portion surrounding the exhaust side of the filter and the permanent magnet is disposed outward of the perimeter seal portion, such that the permanent magnet is configured to be disposed outside an air flow path of a floor cleaner.

15. The filter assembly of claim 14, wherein the seal is overmolded on the filter housing and comprises a handle seal portion extending from the perimeter seal portion at least partially over the handle to overlie the permanent magnet.

* * * * *